United States Patent
Kim et al.

(10) Patent No.: US 9,508,737 B2
(45) Date of Patent: Nov. 29, 2016

(54) SEMICONDUCTOR DEVICE AND METHOD OF FABRICATING THE SAME

(71) Applicants: Jung-Hwan Kim, Seoul (KR); Hanvit Yang, Yongin-si (KR); Jintae Noh, Yongin-si (KR); Dongchul Yoo, Seongnam-si (KR)

(72) Inventors: Jung-Hwan Kim, Seoul (KR); Hanvit Yang, Yongin-si (KR); Jintae Noh, Yongin-si (KR); Dongchul Yoo, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 9 days.

(21) Appl. No.: 14/539,140

(22) Filed: Nov. 12, 2014

(65) Prior Publication Data
US 2015/0279857 A1    Oct. 1, 2015

(30) Foreign Application Priority Data

Mar. 31, 2014  (KR) .................. 10-2014-0037894

(51) Int. Cl.
| | |
|---|---|
| H01L 21/04 | (2006.01) |
| H01L 21/20 | (2006.01) |
| H01L 21/336 | (2006.01) |
| H01L 27/115 | (2006.01) |
| H01L 29/788 | (2006.01) |
| H01L 29/792 | (2006.01) |

(52) U.S. Cl.
CPC .................... *H01L 27/11582* (2013.01)

(58) Field of Classification Search
CPC ............ H01L 27/11551; H01L 27/11582; H01L 27/11578; H01L 27/11556
USPC .......... 257/324, 499, E27.026; 438/243, 588
See application file for complete search history.

(56) References Cited

U.S. PATENT DOCUMENTS

| | | |
|---|---|---|
| 6,380,032 B1 | 4/2002 | Lee et al. |
| 7,238,569 B2 | 7/2007 | Torii |
| 7,876,597 B2 | 1/2011 | Liu |
| 7,952,136 B2 | 5/2011 | Kito et al. |
| 8,748,249 B2 | 6/2014 | Yang et al. |
| 2006/0240617 A1 | 10/2006 | Torii |
| 2008/0099819 A1 | 5/2008 | Kito et al. |
| 2009/0073741 A1 | 3/2009 | Liu |
| 2011/0306195 A1 | 12/2011 | Kim et al. |
| 2012/0003831 A1 | 1/2012 | Kang et al. |

(Continued)

FOREIGN PATENT DOCUMENTS

| | | |
|---|---|---|
| JP | 5100080 B2 | 12/2012 |
| KR | 100356773 B2 | 10/2002 |
| KR | 100732391 B1 | 6/2007 |
| KR | 1020100080182 A | 7/2010 |
| KR | 1020130047405 A | 5/2013 |

*Primary Examiner* — Kimberly Rizkallah
*Assistant Examiner* — Brian Turner
(74) *Attorney, Agent, or Firm* — Harness, Dickey & Pierce, PLC

(57) ABSTRACT

Inventive concepts provide semiconductor memory devices and methods of fabricating the same. A stack structure and vertical channel structures are provided on a substrate. The stack structure includes insulating layers and gate electrodes alternately and repeatedly stacked on the substrate. A first vertical channel pattern is disposed in a lower portion of each vertical channel structure. A gate oxide layer is formed on a sidewall of the first vertical channel pattern. A recess region is formed in the substrate between the vertical channel structures. A buffer oxide layer is formed in the recess region. An oxidation inhibiting layer is provided in the substrate to surround the recess region. The oxidation inhibiting layer is in contact with the buffer oxide layer and inhibits growth of the buffer oxide layer.

20 Claims, 31 Drawing Sheets

(56) References Cited

U.S. PATENT DOCUMENTS

| | | |
|---|---|---|
| 2012/0086072 A1 | 4/2012 | Yun et al. |
| 2012/0112260 A1* | 5/2012 | Kim .................. H01L 27/11556 |
| | | 257/315 |
| 2012/0112264 A1* | 5/2012 | Lee .................... H01L 27/11551 |
| | | 257/324 |
| 2012/0205722 A1 | 8/2012 | Lee et al. |
| 2012/0276696 A1 | 11/2012 | Yang et al. |
| 2013/0109158 A1 | 5/2013 | Lee et al. |

* cited by examiner

SEMICONDUCTOR DEVICE AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0037894, filed on Mar. 31, 2014, in the Korean Intellectual Property Office, the disclosure of which is hereby incorporated by reference in its entirety.

BACKGROUND

The inventive concepts relate to semiconductor devices and methods of fabricating the same and, more particularly, to semiconductor memory devices and methods of fabricating the same.

Semiconductor devices are becoming more highly integrated to provide high performance and low costs. The integration density of semiconductor memory devices directly affects the costs of the semiconductor memory devices, thereby resulting in a demand of highly integrated semiconductor devices. An integration density of a conventional two-dimensional (2D) or planar memory device is mainly determined by an area which a unit memory cell occupies. Therefore, the integration density of the conventional 2D memory device is greatly affected by a technique of forming fine patterns. However, since extremely high-priced apparatuses are needed to form fine patterns, the integration density of 2D memory devices continues to increase but is still limited. Thus, various researches are conducted for a semiconductor memory device including memory cells that are vertically arranged.

SUMMARY

Example embodiments of the inventive concepts may provide semiconductor memory devices capable of increasing an integration degree and improving electrical characteristics.

Example embodiments of the inventive concepts may also provide methods of fabricating a semiconductor memory device capable of increasing an integration degree and improving electrical characteristics.

In one aspect, a method of fabricating a semiconductor memory device may include forming a molding structure including insulating layers and sacrificial layers that are alternately and repeatedly stacked on a substrate, forming vertical channel structures penetrating the molding structure, each of the vertical channel structures comprising a first vertical channel pattern being in contact with the substrate and a second vertical channel pattern formed on the first vertical channel pattern, forming a trench penetrating the molding structure between the vertical channel structures, the trench comprising a first recess region that is formed by partially recessing the substrate, forming an oxidation inhibiting layer in or on the substrate exposed by the first recess region, forming a common source region surrounding the oxidation inhibiting layer in the substrate; and forming a buffer oxide layer on the oxidation inhibiting layer.

In some example embodiments, forming the vertical channel structures may include forming channel holes penetrating the molding structure, each of the channel holes comprising a second recess region that is formed by recessing the substrate; forming a first vertical channel pattern that fills the second recess region of each of the channel holes and protrudes from the substrate; and forming a data storage pattern, a second vertical channel pattern, and a filling insulation pattern which are disposed on the first vertical channel pattern and are sequentially stacked on an inner sidewall of each of the channel holes.

In some example embodiments, the data storage pattern may include a blocking dielectric layer, a charge storage layer, and a tunnel dielectric layer which are sequentially formed on the inner sidewall of each of the channel holes.

In some example embodiments, the first and second vertical channel patterns may include a semiconductor material.

In some example embodiments, the oxidation inhibiting layer may include nitrogen.

In some example embodiments, the oxidation inhibiting layer may be a doped layer including nitrogen and formed in the substrate, or a nitridation layer formed by performing a nitridation process on the substrate.

In some example embodiments, the method may further include forming a gate oxide layer on a sidewall of the first vertical channel pattern.

In some example embodiments, a thickness of a central portion of the gate oxide layer may be greater than a thickness of the buffer oxide layer formed on an upper portion of a sidewall of the first recess region.

In some example embodiments, the method may further include forming a diffusion inhibiting layer surrounding the common source region in the substrate.

In some example embodiments, the diffusion inhibiting layer may include carbon.

In another aspect, a method of fabricating a semiconductor device may include forming a semiconductor pattern protruding vertically from a substrate, forming a recess region in the substrate, forming an oxidation inhibiting layer in the substrate adjacent to the recess region, the oxidation inhibiting layer surrounding the recess region and including nitrogen, forming a gate oxide layer on a sidewall of the semiconductor pattern and a buffer oxide layer in the recess region by the same oxidation process, forming a gate electrode on a sidewall of the gate oxide layer, and forming a conductive via plug penetrating the buffer oxide layer.

In some example embodiments, a thickness of a central portion of the gate oxide layer may be greater than a thickness of the buffer oxide layer formed on an upper portion of a sidewall of the recess region.

In some example embodiments, the method may further include forming a conductive dopant region surrounding the oxidation inhibiting layer; and forming a diffusion inhibiting layer in the substrate, the diffusion inhibiting layer surrounding the conductive dopant region and including carbon.

In still another aspect, a method of fabricating a semiconductor memory device may include forming vertical channel structures extending vertically on a substrate, each of the vertical channel structures comprising a first vertical channel pattern being in contact with the substrate and a second vertical channel pattern disposed on the first vertical channel pattern, forming a recess region in the substrate between the vertical channel structures, forming a gate oxide layer including a central portion with a first thickness on a sidewall of the first vertical channel pattern, forming a buffer oxide layer in the recess region, the buffer oxide layer having a second thickness on an upper portion of a sidewall of the recess region and a third thickness on a bottom surface of the recess region, and the second and third thicknesses being smaller than the first thickness, forming a common source region adjacent to the buffer oxide layer in the substrate, and forming gate electrodes surrounding the vertical channel structures and stacked in a direction vertical to the substrate.

In some example embodiments, forming the vertical channel structures may further include forming a tunnel dielectric layer, a charge storage layer, and a blocking dielectric layer on the first vertical channel pattern of each of the vertical channel structures. In this case, the second vertical channel pattern may be connected to the first vertical channel pattern, and the blocking dielectric layer may be adjacent to the gate electrodes. The tunnel dielectric layer may be in contact with the second vertical channel pattern, and the charge storage layer may be disposed between the tunnel dielectric layer and the blocking dielectric layer.

In some example embodiments, the second thickness of the buffer oxide layer may be greater than the third thickness of the buffer oxide layer.

In some example embodiments, the method may further include forming an oxidation inhibiting layer including nitrogen between the buffer oxide layer and the common source region. The oxidation inhibiting layer may be a doped layer including nitrogen and formed in the substrate, or a nitridation layer formed by performing a nitridation process on the substrate.

In some example embodiments, the method may further include forming a diffusion inhibiting layer surrounding the common source region in the substrate. The diffusion inhibiting layer may inhibit the common source region from being expanded toward the first vertical channel pattern, and the diffusion inhibiting layer may include carbon.

BRIEF DESCRIPTION OF THE DRAWINGS

The inventive concepts will become more apparent in view of the attached drawings and accompanying detailed description.

FIGS. 7, 8, 9A, 10, and 11A to 16A are cross-sectional views taken along a line I-I' of FIG. 1 to illustrate a method of fabricating a semiconductor memory device according to some example embodiments of the inventive concepts;

FIGS. 11B to 16B are enlarged views of portions B of FIGS. 11A to 16A, respectively;

FIGS. 17A to 19A are cross-sectional views taken along a line I-I' of FIG. 1 to illustrate a method of fabricating a semiconductor memory device according to other example embodiments of the inventive concepts;

FIGS. 17B to 19B are enlarged views of portions B' of FIGS. 17A to 19A, respectively;

DETAILED DESCRIPTION OF EXAMPLE EMBODIMENTS

Figure 1:
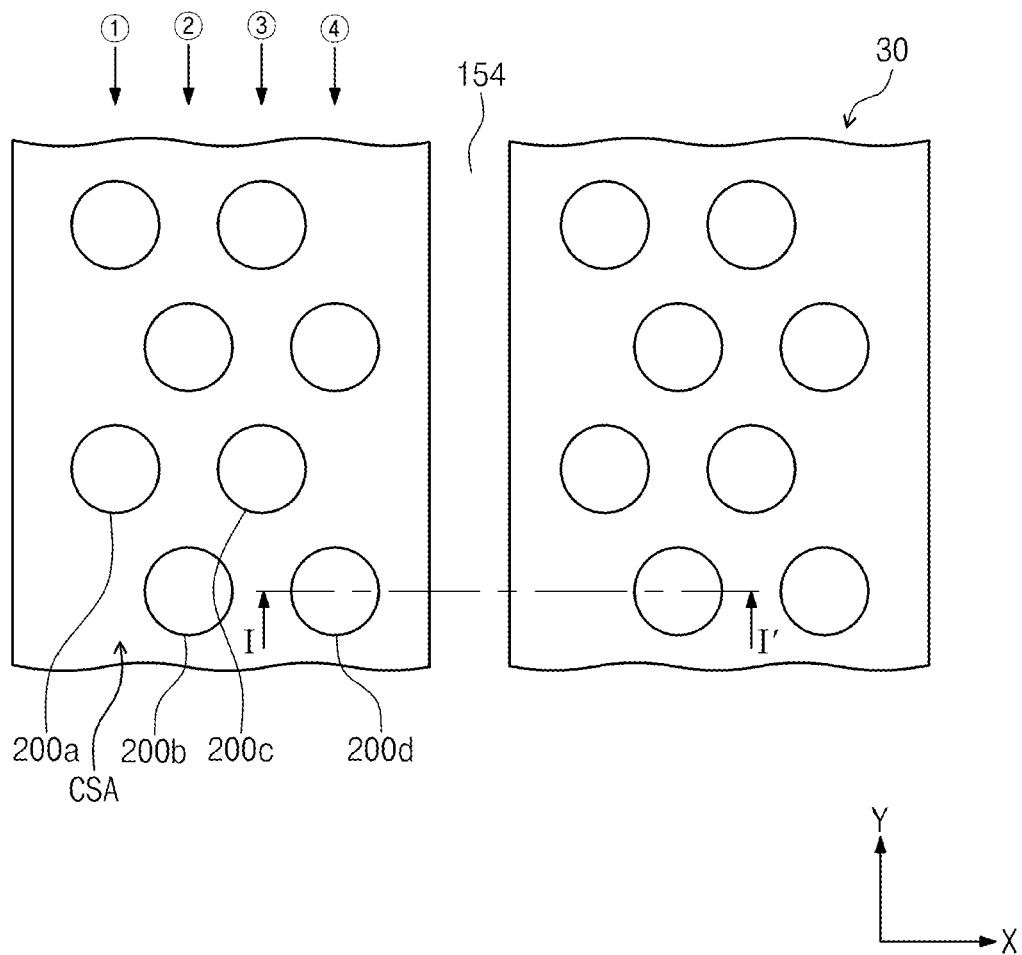
FIG. 1 is a plan view illustrating a semiconductor memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, some example embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Now will be described semiconductor memory devices according to some example embodiments of the inventive concepts and methods of fabricating the same.

Figure 2:
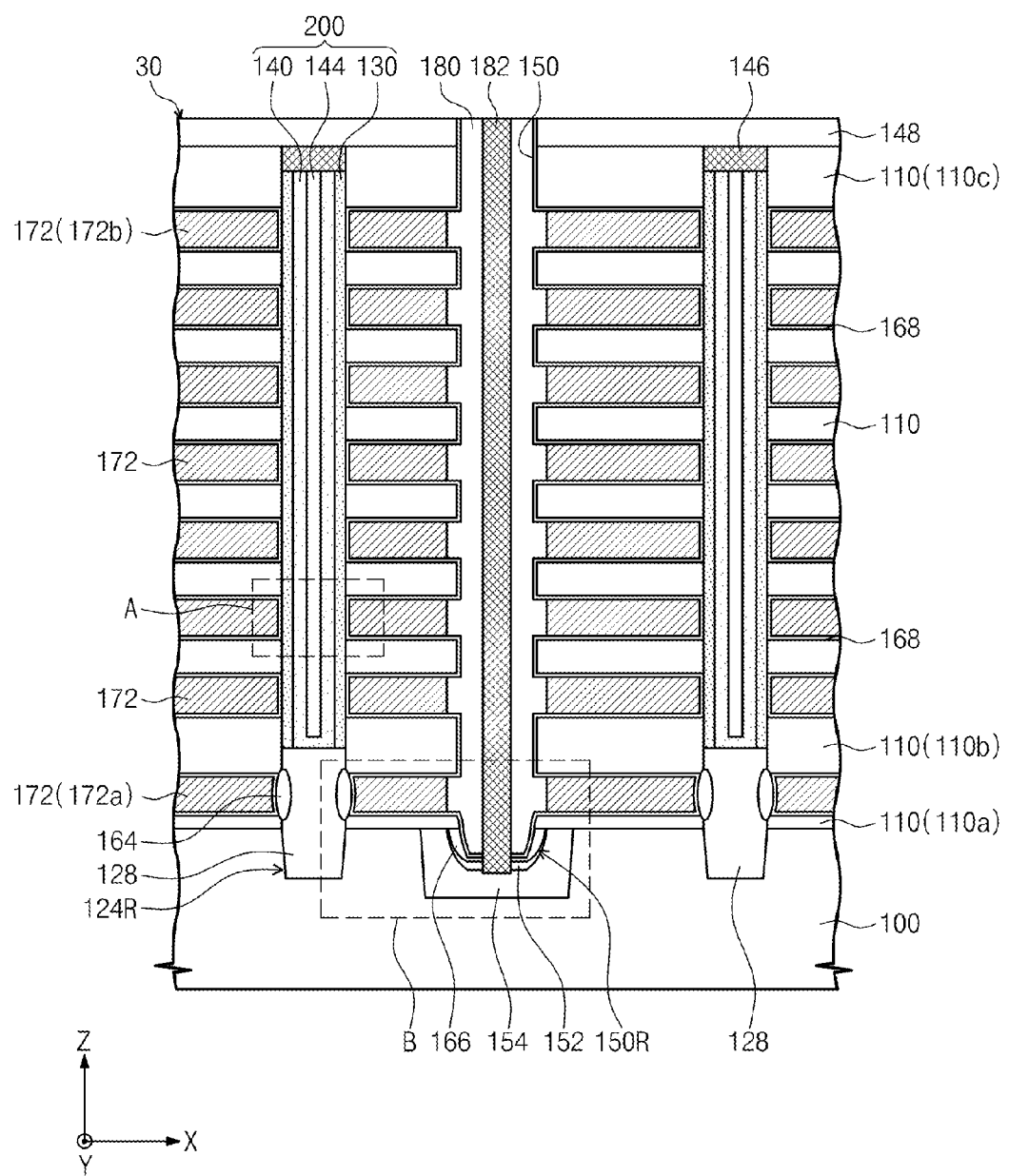
FIG. 2 is a cross-sectional view taken along a line I-I' of FIG. 1 to illustrate a semiconductor memory device according to some example embodiments of the inventive concepts.
Figure 3:
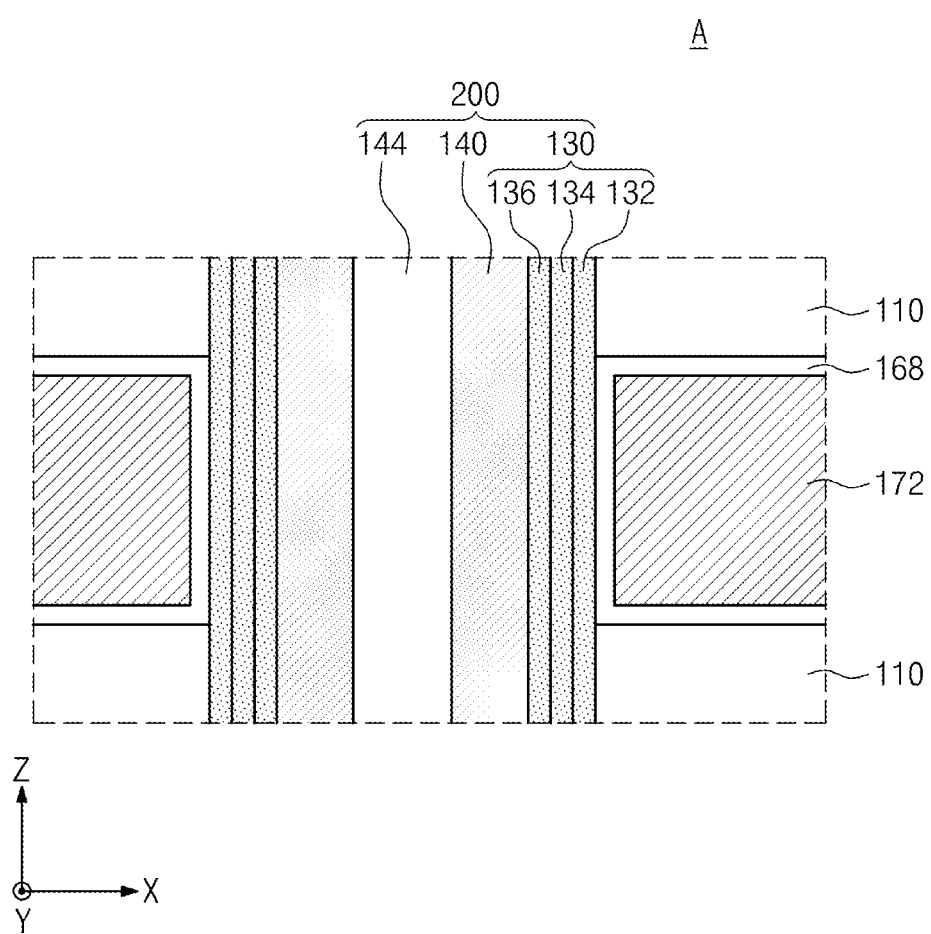
FIGS. 3 and 4 are enlarged views of a portion A and a portion B of FIG. 2, respectively.
Figure 4:
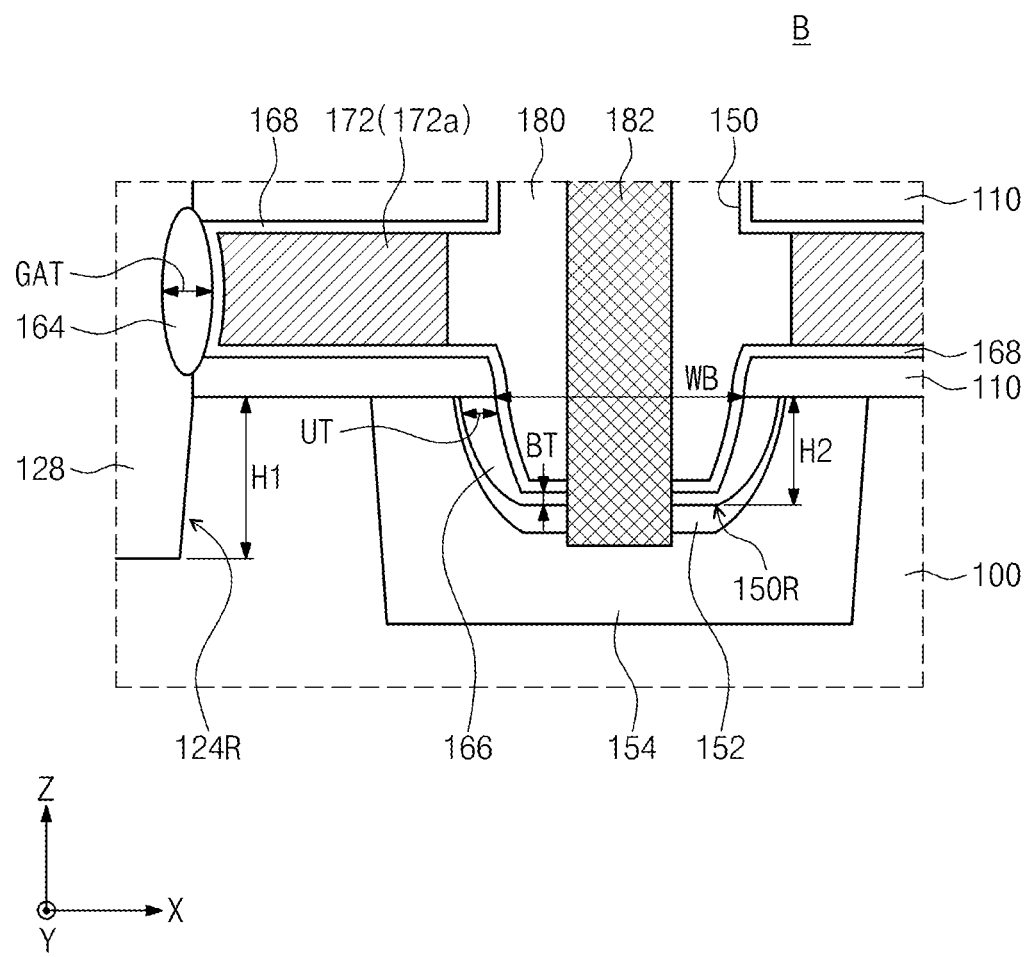

FIG. 1 is a plan view illustrating a semiconductor memory device according to some example embodiments of the inventive concepts. FIG. 2 is a cross-sectional view taken along a line I-I' of FIG. 1 to illustrate a semiconductor memory device according to some example embodiments of the inventive concepts. FIG. 3 is an enlarged view of a portion A of FIG. 2, and FIG. 4 is an enlarged view of a portion B of FIG. 2.

Referring to FIGS. 1 to 4, a semiconductor memory device according to some example embodiments of the inventive concepts may include a stack structure 30 and vertical channel structures 200 penetrating the stack structure 30. The stack structure 30 may include insulating layers 110 and gate electrodes 172 which are alternately and repeatedly stacked on a substrate 100. The vertical channel structures 200 may be spaced apart from each other in a first direction (e.g., an X-direction) parallel to a main surface of the substrate 100. The vertical channel structures 200 may extend from the substrate 100 in a third direction (e.g., a Z-direction) perpendicular to the main surface of the substrate 100. The semiconductor memory device according to some example embodiments of the inventive concepts may be a vertical semiconductor memory device.

The substrate 100 may be of a semiconductor material. For example, the substrate 100 may be a single-crystalline silicon substrate, a single-crystalline germanium substrate, or a single-crystalline silicon-germanium substrate. Alternatively, the substrate 100 may be a silicon-on-insulator (SOI) substrate. For example, the substrate 100 may include a semiconductor layer (e.g., a silicon layer, a silicon-germanium layer, or a germanium layer) that is disposed on an insulating layer protecting transistors provided on a semiconductor substrate. The substrate 100 may be a semiconductor substrate having a first conductivity type (e.g., a P-type).

The stack structure 30 may have a linear shape extending in a second direction (e.g., a Y-direction) intersecting the first direction, as illustrated in FIG. 1. For example, the first direction and the second direction may be parallel to the main surface of the substrate 100. The insulating layers 110 may be stacked on the substrate 100 in the third direction. Thicknesses of the insulating layers 110 may be smaller than those of the gate electrodes 172. In other example embodiments, a thickness of at least one of the insulating layers 110 may be greater than those of the gate electrodes 172. For example, a second insulating layer 110b from the substrate 100 and an uppermost insulating layer 110c may be thicker than the gate electrodes 172. The second insulating layer 110b may correspond to a next lowermost one of the insulating layers 110. In still other example embodiments, the thicknesses of the insulating layers 110 may be equal to those of the gate electrodes 172. One insulating layer 110a, being in contact with the substrate 100, of the insulating layers 110 may be thinner than other insulating layers 110 disposed thereon. Each of the insulating layers 110 may include, for example, a silicon oxide layer.

The gate electrodes 172 may be stacked on the substrate 100 in the third direction. The gate electrodes 172 may include control gate electrodes of memory cells included in the vertical semiconductor memory device (e.g., a vertical NAND flash memory device). For example, the gate electrodes 172 disposed between an uppermost gate electrode 172b and a lowermost gate electrode 172a may be word lines corresponding to the control gate electrodes. Here, the gate electrodes 220 and the vertical channel structures 200 may constitute a plurality of memory cell strings, each of which includes a plurality of the memory cells arranged on the substrate 100 along the third direction.

The lowermost and uppermost gate electrodes 172a and 172b may be used as gate electrodes of selection transistors GST and SST. For example, the uppermost gate electrode 172b may be used as a gate electrode of a string selection transistor SST controlling electrical connection between a bit line (not shown) and the vertical channel structures 200, and the lowermost gate electrode 172a may be used as a gate electrode of a ground selection transistor GST controlling electrical connection between a common source region 154 formed in the substrate 100 and the vertical channel structures 200.

The gate electrodes 172 may be disposed between the insulating layers 110. The gate electrodes 172 may surround the vertical channel structure 200. Each of the gate electrodes 172 may include a gate conductive layer. The gate conductive layer may include a metal silicide layer or a metal conductive layer. For example, the metal silicide layer may include at least one of a cobalt silicide layer, a titanium silicide layer, a tungsten silicide layer, or a tantalum silicide layer. The metal conductive layer may include at least one of, but not limited to, a tungsten layer, a nickel layer, a cobalt layer, a titanium layer, or a tantalum layer.

The vertical channel structures 200 may penetrate the stack structure 30 so as to be electrically connected to the substrate 100. Referring to FIG. 1, the vertical channel structures 200 may be arranged along a first column ① and a second column ② parallel to the second direction. A vertical channel structure array CSA may include the vertical channel structures 200 arranged along the first and second columns ① and ②. First vertical channel structures 200a in the first column ① may be spaced apart from second vertical channel structures 200b in the second column ②. The first and second vertical channel structures 200a and 200b of the first and second columns ① and ② may be arranged in a zigzag form along the second direction. Not symmetric are the first vertical channel structures 200a and the second vertical channel structures 200b in the first direction. For example, the first vertical channel structures 200a may be respectively shifted from the second vertical channel structures 200b by half the pitch of the second vertical channel structures 200b in the second direction.

In addition, the vertical channel structure array CSA may further include third and fourth vertical channel structures 200c and 200d of third and fourth columns ③ and ④ that are disposed at a side of the first and second vertical channel structures 200a and 200b in the first direction. The first and third vertical channel structures 200a and 200c may be symmetric with respect to the second column ②. The second and fourth vertical channel structures 200b and 200d may be symmetric with respect to the third column ③. A plurality of the vertical channel structure arrays CSA may be repeatedly arranged in the first direction with the common source region 154 therebetween.

The above example embodiments of the inventive concepts is exemplified as the vertical channel structures 200 are arranged along the four columns. However, the inventive concepts are not limited thereto. In other example embodiments, the vertical channel structures 200 may be arranged along columns of which the number is smaller or greater than four.

The vertical channel structures 200 may penetrate a plurality of the gate electrodes 172. Each of the gate electrodes 172 may surround the vertical channel structures 200. Each of the vertical channel structures 200 may include a first vertical channel pattern 128, a data storage pattern 130, a second vertical channel pattern 140, and a filling insulation pattern 144. The data storage pattern 130, the second vertical channel pattern 140, and the filling insulation pattern 144 may be disposed on the first vertical channel pattern 128. The first vertical channel pattern 128 may extend into the substrate 100. The first vertical channel pattern 128 may be a pillar-shaped pattern that fills a first recess region 124R formed in the substrate 100 and protrudes upward from the substrate 100. The first vertical channel pattern 128 may be disposed in a lower portion of the stack structure 30. A bottom surface of the first vertical channel pattern 128 may be disposed at a depth H1 from a top surface of the substrate 100, and a top surface thereof may be higher than that of a lowermost gate electrode 172a adjacent to the substrate 100 (e.g., a top surface of the gate electrode of the ground selection transistor). The first vertical channel pattern 128 may be a semiconductor pattern. For example, the first vertical channel pattern 128 may include silicon (Si), germanium (Ge), or a mixture thereof. For example, the first vertical channel pattern 128 may be an epitaxial layer including single-crystalline silicon. The first vertical channel pattern 128 may include an undoped semiconductor material, or a semiconductor material doped with dopants of which a conductivity type is the same as that of the substrate 100.

A gate oxide layer 164 may be disposed on a sidewall of the first vertical channel pattern 128. The gate oxide layer 164 may be disposed between the lowermost gate electrode 172a and the first vertical channel pattern 128.

The second vertical channel pattern 140 may be disposed on the first vertical channel pattern 128. The second vertical channel pattern 140 may be connected to the first vertical channel pattern 128. The second vertical channel pattern 140 may be disposed between the data storage pattern 130 and the filling insulation pattern 144. The second vertical channel pattern 140 may have a hollow macaroni shape with an opened top end. In some example embodiments, the second vertical channel pattern 140 may have a pipe shape with opened top and bottom ends. In other example embodiments, the second vertical channel pattern 140 may have a filled cylinder shape and the filling insulation pattern 144 may be omitted. The second vertical channel pattern 140 may have a poly-crystalline or single-crystalline semiconductor material. For example, the second vertical channel pattern 140 may include silicon (Si), germanium (Ge), or a mixture thereof. For example, the second vertical channel pattern 140 may be an epitaxial layer including single-crystalline silicon. For example, the second vertical channel pattern 140 may include an undoped semiconductor material, or a semiconductor material doped with dopants of which a conductivity type is the same as that of the substrate 100.

The data storage pattern 130 may be disposed between the stack structure 30 and the second vertical channel pattern 140. The data storage pattern 130 may have a pipe shape of which top and bottom ends are opened. For example, data stored in the data storage pattern 130 may be changed using the Fowler-Nordheim tunneling effect caused by a voltage difference between the vertical channel structure 200 and the gate electrodes 172. However, the inventive concepts are not limited thereto. Alternatively, the data storage pattern 130 may have a thin layer capable of storing data based on another operation principle (e.g., a thin layer used for a phase change memory device or a thin layer used for a variable resistance memory device).

The data storage pattern 130 may include a first blocking dielectric layer 132 adjacent to the gate electrodes 172, a tunnel dielectric layer 136 adjacent to the second vertical channel pattern 140, and a charge storage layer 134 disposed between the first blocking dielectric layer 132 and the tunnel dielectric layer 136. The tunnel dielectric layer 136 may include, for example, a silicon oxide layer. The charge storage layer 134 may include a trap insulating layer, or an insulating layer including conductive nano dots. The trap insulating layer may contain, for example, a silicon nitride layer. The first blocking dielectric layer 132 may include a silicon oxide layer and/or a high-k dielectric layer (e.g., an aluminum oxide layer or a hafnium oxide layer). The first blocking dielectric layer 132 may be a single layer or a multi-layer including a plurality of thin layers. In some example embodiments, the first blocking dielectric layer 132 may be a single layer having a silicon oxide layer. In other example embodiments, the first blocking dielectric layer 132 may include a plurality of thin layers including at least two of a silicon oxide layer, an aluminum oxide layer, and/or a hafnium oxide layer.

A second blocking dielectric layer 168 may be additionally provided between the stack structure 30 and the second vertical channel pattern 140 so as to extend between the insulating layers 110 and the gate electrodes 172. For example, the second blocking dielectric layer 168 may extend in a direction substantially horizontal to the substrate 100, thereby covering top surfaces and bottom surfaces of the gate electrodes 172. For example, the second blocking dielectric layer 168 may be single-layered or multi-layered. For example, the second blocking dielectric layer 168 may include a high-k dielectric layer (e.g., an aluminum oxide layer and/or a hafnium oxide layer). In some example embodiments, the second blocking dielectric layer 168 may not be formed.

The filling insulation pattern 144 may fill an inner space of the vertical channel structure 200. The filling insulation pattern 144 may include a silicon oxide layer or a silicon nitride layer.

A conductive pad 146 may be disposed on each of the vertical channel structures 200. The conductive pad 146 may include a conductive material. Alternatively, the conductive pad 146 may be a dopant region doped with dopants. One end, which is in contact with the conductive pad 146, of the vertical channel structure 200 may be a drain region. The conductive pad 146 may be connected to the bit line (not shown) formed thereon.

A second recess region 150R may be formed in the substrate 100 between the vertical channel structures 200. For example, the second recess region 150R may be formed in the substrate 100 between the channel structure arrays CSA including the vertical channel structures 200 of at least two columns symmetric in the first direction. For example, the second recess region 150R may be a region, which extends into the substrate 100, of a trench 150 formed between the stack structures 200. For example, the substrate 100 may be over-etched when the trench 150 is formed. At this time, the second recess region 150R may be formed. The second recess region 150R may have a positively sloped sidewall.

A buffer oxide layer 166 may be disposed in the second recess region 150R. An oxidation inhibiting layer 152 may be in contact with the buffer oxide layer 166 and may be disposed in or on the substrate 100 adjacent to the second recess region 150R. For example, the buffer oxide layer 166 may be formed on the sidewall and a bottom surface of the second recess region 150R, and the oxidation inhibiting layer 152 may be formed between the buffer oxide layer 166 and the common source region 154. The buffer oxide layer 166 and the gate oxide layer 164 may be formed at the same time by the same oxidation process. The gate oxide layer 164 may be formed to have a thickness capable of enduring a voltage applied for operating the ground selection transistor. Referring to FIG. 4, the buffer oxide layer 166 may have a positively sloped sidewall. The buffer oxide layer 166 may have a first thickness UT on an upper portion of the sidewall of the second recess region 150R and may have a second thickness BT on the bottom surface of the second recess region 150R. For example, the first thickness UT of an upper portion of the buffer oxide layer 166 may be greater than the second thickness BT of a bottom portion of the buffer oxide layer 166. A width WB of an upper portion of the second recess region 150R may be determined by the first thickness UT of the upper portion of the buffer oxide layer 166. A bottom surface of the bottom portion of the buffer oxide layer 166 may be disposed at a depth H2 from the top surface of the substrate 100. For example, the depth H1 may be greater than the depth H2. In other words, the bottom surface of the first recess region 124R may be deeper than the bottom surface of the bottom portion of the buffer oxide layer 166, from the top surface of the substrate 100. The second blocking insulating layer 168 may also be provided on the buffer oxide layer 166. The second blocking insulating layer 168 may be conformally formed in the second recess region 150R. The oxidation inhibiting layer 152 adjacent to the bottom surface of the second recess region 150R may be formed more deeply than the oxidation inhibiting layer 152 adjacent to the sidewall of the second recess region 150R. The oxidation inhibiting layer 152 may include a material capable of inhibiting oxidation. The oxidation inhibiting layer 152 may include nitrogen. For example, the oxidation inhibiting layer 152 may be a doped layer including nitrogen (i.e., a nitrogen-doped layer). For example, the doped layer including nitrogen may be formed by an ion implantation process or a plasma doping process. For example, a nitrogen concentration of the oxidation inhibiting layer 152 may be in a range of about $10^{19}$ ions/cm$^3$ to about $10^{21}$ ions/cm$^3$. Alternatively, the oxidation inhibiting layer 152 may be a nitridation layer. In some example embodiments, the oxidation inhibiting layer 152 may be a plasma nitridation layer that is formed by performing a plasma nitridation process on a surface of the substrate 100 adjacent to the second recess region 150R in a plasma atmosphere. In other example embodiments, the oxidation inhibiting layer 152 may be a RTN nitridation layer that is formed by a rapid thermal nitridation (RTN) process.

The common source region 154 may be formed in the substrate 100 and may surround the oxidation inhibiting layer 152. For example, the common source region 154 extending in the second direction may be formed in the substrate 100 exposed by the trench 150 formed between the stack structures 30. The common source region 154 may include a conductive dopant region. The common source region 154 may include dopants of which a second conductivity type is different from the first conductivity type of the substrate 100. For example, the common source region 154 may be doped with N-type dopants.

A source via plug 182 may be disposed on the common source region 154. The source via plug 182 may be disposed in the trench 150 and may extend into the second recess region 150R so as to be connected to the common source region 154. The source via plug 182 may reduce a resistance of the common source region 154. The source via plug 182 may penetrate the second blocking dielectric layer 168 and the buffer oxide layer 166 so as to be connected to the common source region 154. The source via plug 182 may penetrate the oxidation inhibiting layer 152 so as to be in direct contact with the common source region 154. A silicide layer (not shown) may be formed between the source via plug 182 and the common source region 154. The source via plug 182 may have an island shape. In this case, a plurality of source via plugs 182 may be provided on the common source region 154 and may be arranged in the second direction. Alternatively, the source via plug 182 may have a linear shape extending in the second direction. The source via plug 182 may include a conductive material. For example, the source via plug 182 may include a metal such as tungsten or copper.

An isolation insulating layer 180 may be disposed between the stack structure 30 and the source via plug 182. For example, the isolation insulating layer 180 may be disposed between the source via plug 182 and the gate electrodes 172. The isolation insulating layer 180 may partially fill the trench 150 and the second recess region 150R and may be in contact with the gate electrodes 172. The isolation insulating layer 180 may fill spaces between the insulating layers 110 to protect sidewalls of the gate electrodes 172. An opening may penetrate the isolation insulating layer 180, and the source via plug 182 may be disposed in the opening of the isolation insulating layer 180. The opening of the isolation insulating layer 180 may have a hole or slit shape. The isolation insulating layer 180 may include an oxide layer (e.g., a silicon oxide layer).

Figure 5:
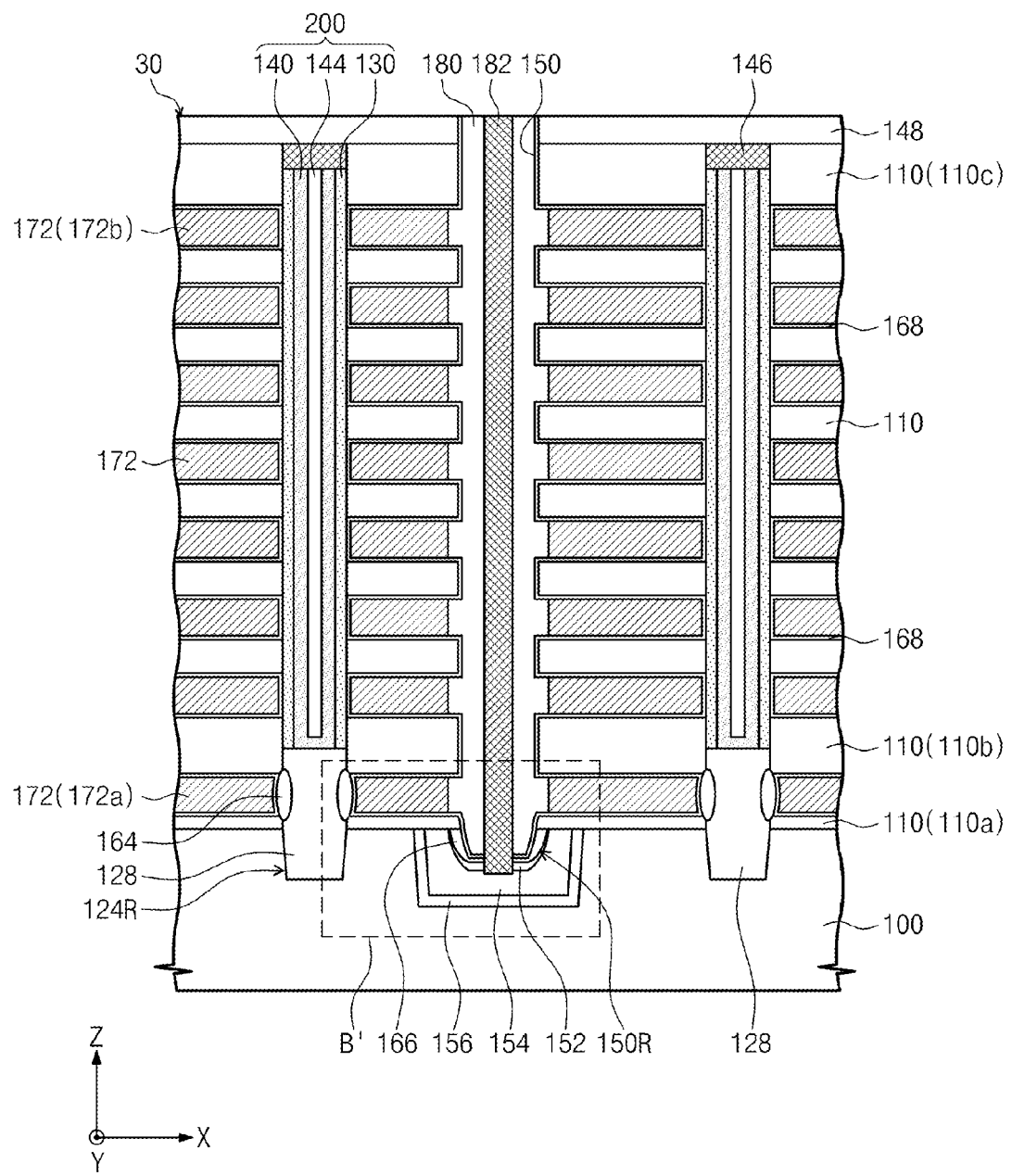
FIG. 5 is a cross-sectional view taken along a line I-I' of FIG. 1 to illustrate a semiconductor memory device according to other example embodiments of the inventive concepts.
Figure 6:
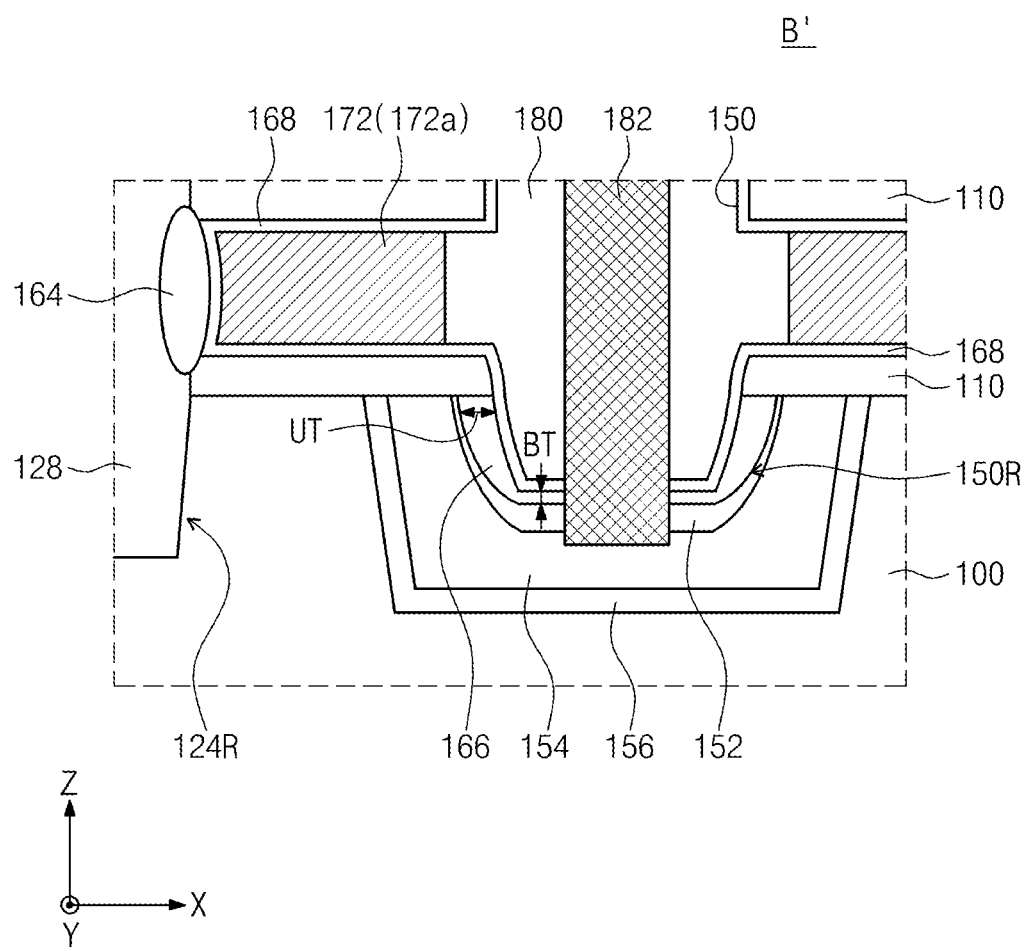
FIG. 6 is an enlarged view of a portion B' of FIG. 5.

FIG. 5 is a cross-sectional view taken along a line I-I' of FIG. 1 to illustrate a semiconductor memory device according to other example embodiments of the inventive concepts. FIG. 6 is an enlarged view of a portion B' of FIG. 5. Hereinafter, the descriptions to the same elements as described in the example embodiments illustrated in FIGS. 1 to 4 will be omitted or mentioned briefly for the purpose of ease and convenience in explanation. In other words, differences between the present embodiment and the example embodiments of FIGS. 1 to 4 will be mainly described.

Referring to FIGS. 1, 5, and 6, a diffusion inhibiting layer 156 may be disposed to surround the common source region 154. The diffusion inhibiting layer 156 may reduce or prevent the dopants of the common source region 154 from being diffused toward the first vertical channel pattern 128 through the substrate 100. If the common source region 154 is expanded toward the first vertical channel region 128, there may be shorted a channel length of the ground selection transistor controlled by the lowermost gate electrode 172a adjacent to the substrate 100, thereby causing an operation error of the ground selection transistor. However, the diffusion inhibiting layer 156 surrounds the common source region 154 in the present embodiments, and thus, the expansion of the common source region 154 may be inhibited to secure a sufficient channel length of the ground selection transistor. In other words, it is possible to improve reliability of the semiconductor memory device according to example embodiments of the inventive concepts. The diffusion inhibiting layer 156 may include carbon. For example, the diffusion inhibiting layer 156 may be a carbon-doped layer that is formed by implanting carbon ions. For example, a carbon concentration of the carbon-doped diffusion inhibiting layer 156 may be in a range of about $10^{19}$ ions/cm$^3$ to about $10^{21}$ ions/cm$^3$.

FIGS. 7, 8, 9A, 10, and 11A to 16A are cross-sectional views taken along a line I-I' of FIG. 1 to illustrate a method of fabricating a semiconductor memory device according to some example embodiments of the inventive concepts. FIG. 9B is an enlarged view of a portion A of FIG. 9A. FIGS. 11B to 16B are enlarged views of portions B of FIGS. 11A to 16A, respectively.

Figure 7:
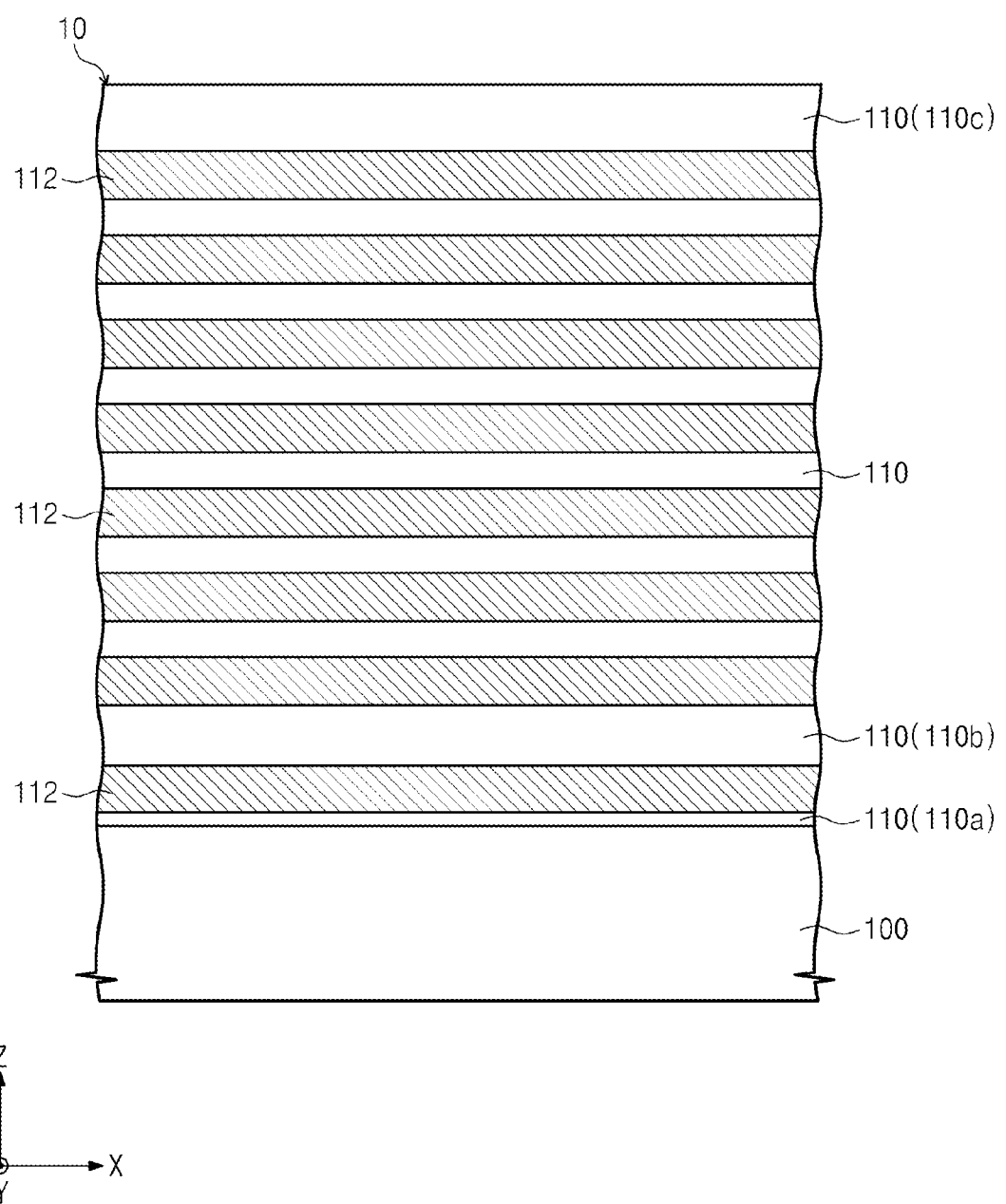

Referring to FIG. 7, a molding structure 10 may be formed on a substrate 100. For example, insulating layers 110 and sacrificial layers 112 may be alternately and repeatedly stacked on the substrate 100 to form the molding structure 10.

The substrate 100 may include a semiconductor material. For example, the substrate 100 may be a single-crystalline silicon substrate, a single-crystalline germanium substrate, or a single-crystalline silicon-germanium substrate. Alternatively, the substrate 100 may be a silicon-on-insulator (SOI) substrate. For example, the substrate 100 may include a semiconductor layer (e.g., a silicon layer, a silicon-germanium layer, or a germanium layer) that is disposed on an insulating layer of protecting transistors provided on a semiconductor substrate. The substrate 100 may be a semiconductor substrate having a first conductivity type (e.g., a P-type).

The sacrificial layers 112 may be formed of a material that has an etch selectivity with respect to the insulating layers 110. For example, an etch rate of the sacrificial layers 112 may be higher than that of the insulating layers 110 during a wet etching process using a chemical solution. In some example embodiments, each of the insulating layers 110 may be a silicon oxide layer or a silicon nitride layer, and each of the sacrificial layers 112 may be formed of a material that is selected from a group consisting of silicon oxide, silicon nitride, silicon carbide, silicon, and silicon-germanium and has the etch selectivity with respect to the insulating layers 110. For example, the insulating layers 110 may be silicon oxide layers, and the sacrificial layers 112 may be silicon nitride layers.

Each of the insulating layers 110 and the sacrificial layers 112 may be formed using a thermal chemical vapor deposition (thermal CVD) process, a plasma enhanced CVD process, or an atomic layer deposition (ALD) process.

Thicknesses of the sacrificial layers 112 may be equal to each other. In some example embodiments, a lowermost insulating layer 110a being in contact with the substrate 100 may be a silicon oxide layer that is formed by a thermal oxidation process or a deposition process. The lowermost insulating layer 110a may be thinner than other insulating layers 110 formed above the lowermost insulating layer 110a. A second insulating layer 110b from the substrate 100 and an uppermost insulating layer 100c may be thicker than the sacrificial layers 112 disposed therebetween. The second insulating layer 110b may correspond to a next lowermost one of the insulating layers 110.

Figure 8:
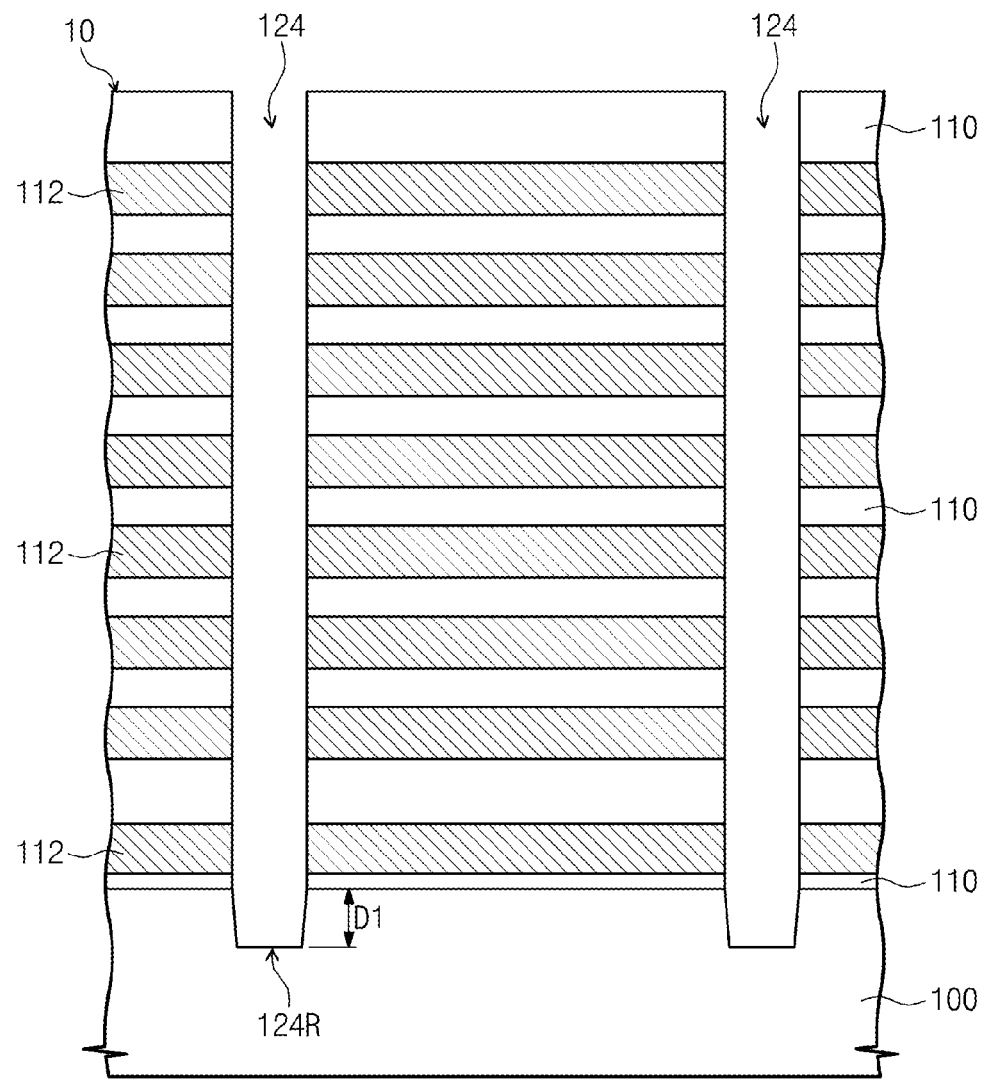

Referring to FIG. 8, channel holes 124 may be formed to penetrate the molding structure 10. The channel holes 124 may expose the substrate 100.

The channel holes 124 may be two-dimensionally arranged like the vertical channel structure array CSA illustrated in FIG. 1. For example, the channel holes 124 may be arranged in a zigzag form along the second direction (e.g., Y-direction) of FIG. 1.

In some example embodiments, a mask pattern (not shown) may be formed on the molding structure 10, and the molding structure 10 may be anisotropically etched using the mask pattern (not shown) as an etch mask to form the channel holes 124. The substrate 100 may be over-etched when the channel holes 124 are formed, thereby making it possible to form first recess regions 124R. The substrate 100 may be etched to a depth D1 to form the first recess region 124R. For example, the depth D1 may be in a range of 10 nm to 200 nm. The first recess region 124R may have a positively sloped sidewall. The mask pattern may be removed after the formation of the channel holes 124.

Figure 9A:
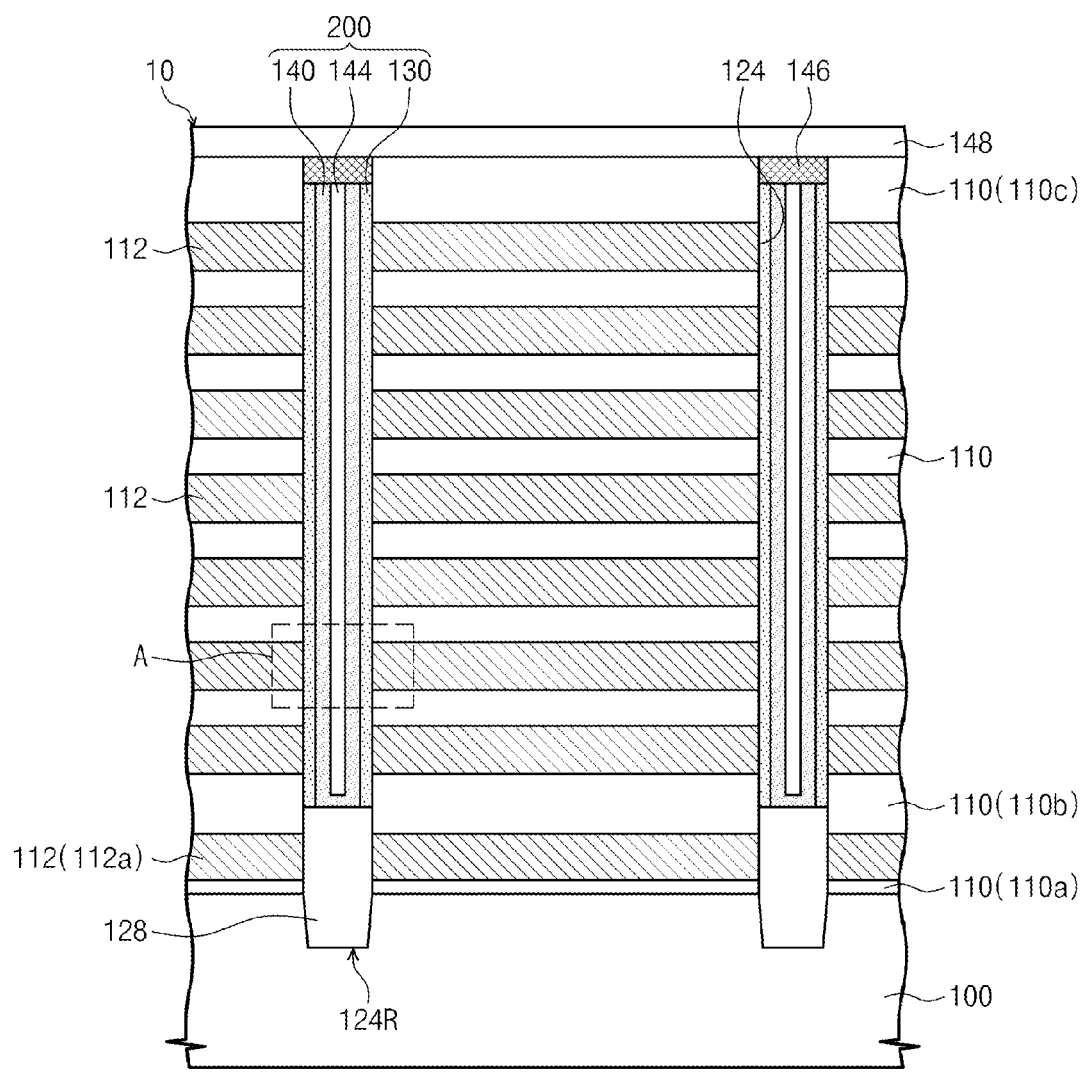
Figure 9B:
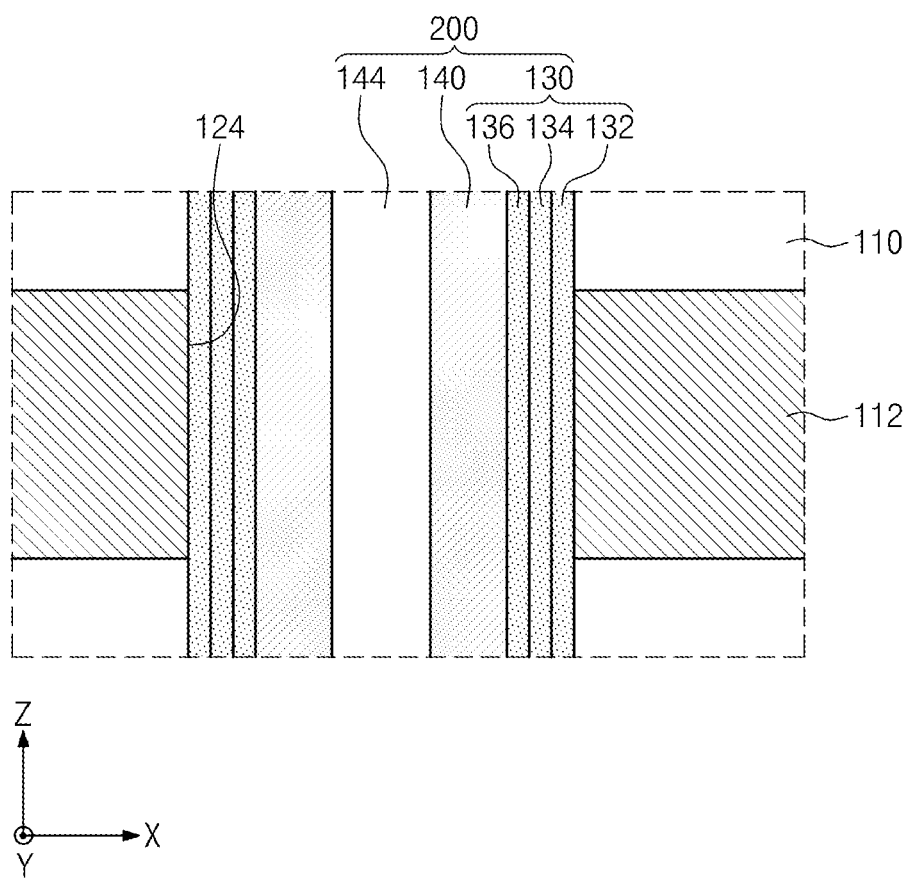
FIG. 9B is an enlarged view of a portion A of FIG. 9A.

Referring to FIGS. 9A and 9B, vertical channel structures 200 may be formed on the substrate 100. The vertical channel structures 200 may penetrate the molding structure 10 and may extend in the third direction. The vertical channel structures 200 may fill the channel holes 124, respectively, and may extend into the substrate 100. Each of the vertical channel structures 200 may include a first vertical channel pattern 128, a data storage pattern 130, a second vertical channel pattern 140, and a filling insulation pattern 144. The first vertical channel pattern 128 may be a pillar-shaped pattern that fills the first recess region 124R and protrudes upward from the substrate 100. The first vertical channel pattern 128 may fill a lower portion of each of the channel holes 124. For example, the first vertical channel pattern 128 may protrude upward from the substrate 100 so as to be in contact with sidewalls of the lowermost insulating layer 110a and a lowermost sacrificial layer 112a and so as to cover a portion of a sidewall of the second insulating layer 110b from the substrate 100. For example, a top surface of the first vertical channel pattern 128 may be lower than a top surface of the second insulating layer 110b from the substrate 100. The first vertical channel pattern 128 may be a semiconductor pattern. For example, the first vertical channel pattern 128 may include a semiconductor material that is formed by a selectively epitaxial growth (SEG) process. The first vertical channel pattern 128 may include dopants of which a conductivity type is the same as that of the substrate 100. In some example embodiments, the first vertical channel pattern 128 may be doped with dopants in-situ during the SEG process. Alternatively, the first vertical channel pattern 128 may be doped with dopants by an ion implantation process.

Next, the data storage pattern 130, the second vertical channel pattern 140, and the filling insulation pattern 144 may be formed on the first vertical channel pattern 128 in each of the channel holes 124 penetrating the molding structure 10.

The data storage pattern 130 may cover an inner sidewall of each of the channel holes 124. For example, the data storage pattern 130 may be a spacer-shaped pattern that is formed on the inner sidewall of the channel hole 124 and may extend from a top end of the channel hole 124 to the top surface of the first vertical channel pattern 128. In some example embodiments, the data storage pattern 130 may have a pipe shape with opened top and bottom ends. The data storage pattern 130 may be in contact with the insulating layers 110 and the sacrificial layers 112 of the molding structure 110. For example, the data storage pattern 130 may include a thin layer capable of storing data using the Fowler-Nordheim tunneling effect. However, the inventive concepts are not limited thereto. In other example embodiments, the data storage pattern 130 may include a thin layer capable of storing data based on another operation principle (e.g., a thin layer used for a phase change memory device or a thin layer used for a variable resistance memory device). The data storage pattern 130 may be formed of a plurality of thin layers.

In some example embodiments, the data storage pattern 130 may include a first blocking dielectric layer 132, a charge storage layer 134, and a tunnel dielectric layer 136, as illustrated in FIG. 9B. For example, the first blocking dielectric layer 132, the charge storage layer 134, and the tunnel dielectric layer 136 may be sequentially stacked on the inner sidewall of the channel hole 124. The first blocking dielectric layer 132 may include a silicon oxide layer and/or a high-k dielectric layer (e.g., an aluminum oxide layer or a hafnium oxide layer). The first blocking dielectric layer 132 may be a single layer or a multi-layer including a plurality of thin layers. In some example embodiments, the first blocking dielectric layer 132 may be a single layer having a silicon oxide layer. In other example embodiments, the first blocking dielectric layer 132 may include a plurality of thin layers including at least two of a silicon oxide layer, an aluminum oxide layer, and/or a hafnium oxide layer.

The charge storage layer 134 may include a trap insulating layer, or an insulating layer including conductive nano dots. For example, the trap insulating layer may include a silicon nitride layer. The tunnel dielectric layer 136 may include, for example, a silicon oxide layer. Each of the first blocking dielectric layer 132 and the charge storage layer 134 may be formed using a plasma enhanced CVD process or an ALD process. The tunnel dielectric layer 136 may be formed using a plasma enhanced CVD process, an ALD process, or a thermal oxidation process. The tunnel dielectric layer 136 may be in contact with the second vertical channel pattern 140.

The second vertical channel pattern 140 may be connected to the first vertical channel pattern 128 and may be in contact with the data storage pattern 130. The second vertical channel pattern 140 may be a liner-shaped pattern that is conformally formed in the channel hole 124. The second vertical channel pattern 140 may have a hollow macaroni shape with an opened top end. In some example embodiments, the second vertical channel pattern 140 may have a pipe shape with opened top and bottom ends. In other example embodiments, the second vertical channel pattern 140 may be a cylinder-shaped pattern that fills the channel hole 124 without the filling insulation pattern 144. The second vertical channel pattern 140 may include a semiconductor material. For example, the second vertical channel pattern 140 may include any one of a poly-crystalline semiconductor material, an amorphous semiconductor material, or a single-crystalline semiconductor material. For example, the second vertical channel pattern 140 may include silicon (Si), germanium (Ge), or a mixture thereof. The second vertical channel pattern 140 may include an undoped semiconductor material, or a semiconductor material doped with dopants of which a conductivity type is the same as that of the substrate 100. The second vertical channel pattern 140 may be formed using an ALD process or a CVD process.

The filling insulation pattern 144 may be formed to fill the channel hole 124 in which the second vertical channel pattern 140 is formed. The filling insulation pattern 144 may include a silicon oxide layer or a silicon nitride layer. Before the filling insulation pattern 144 is formed, a hydrogen annealing process may be further performed to cure crystal defects that may exist in the second vertical channel pattern 140.

A conductive pad 146 may be formed on each of the vertical channel structures 200. In some example embodiments, an upper portion of each of the vertical channel structures 220 may be removed to form a recess region, and the recessed region may be filled with a conductive material to form the conductive pad 146. Alternatively, the conductive pad 146 may be formed by injecting dopants in a top end portion of the second vertical channel pattern 140. A drain region may be formed in the second vertical channel pattern 140 under the conductive pad 146. A cap insulating layer 148 may be formed on the conductive pad 146 and the uppermost insulating layer 110c.

Figure 10:
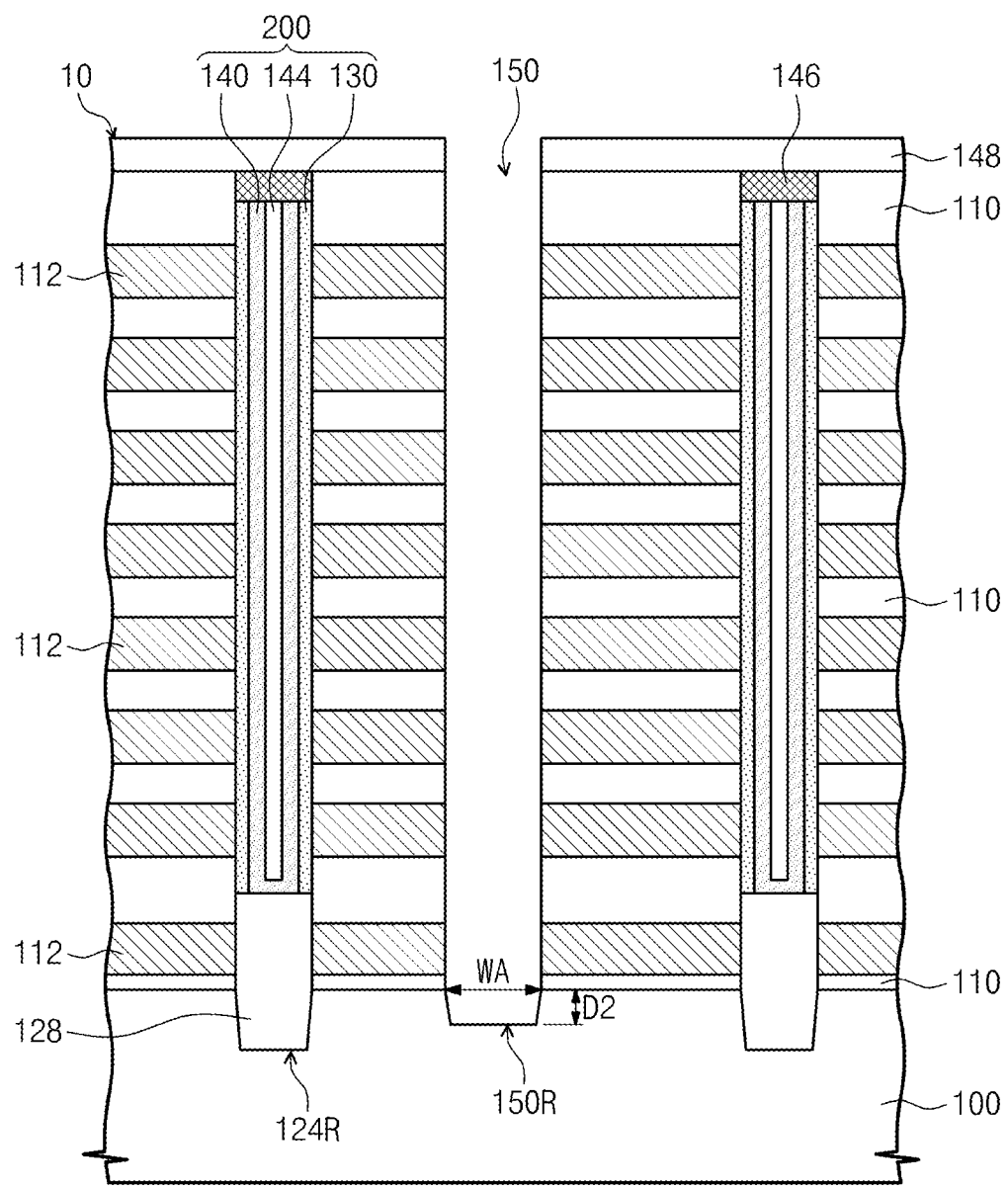

Referring to FIG. 10, the molding structure 100 may be patterned to form a trench 150 between the vertical channel structures 200 adjacent to each other. The trench 150 may expose the substrate 100. For example, a mask pattern (not shown) exposing a region between the vertical channel structure arrays CSA of FIG. 1 may be formed on the molding structure 10, and the molding structure 100 may be anisotropically etched using the mask pattern as an etch mask to form the trench 150. In some example embodiments, the trench 150 may separate the vertical channel structure arrays CSA from each other in the first direction. Each of the vertical channel structure arrays includes the vertical channel structures 200 constituting at least two columns spaced apart from each other in the first direction. The mask pattern may be removed after the trench 150 is formed.

The trench 150 may have a linear shape extending in the second direction. The substrate 100 may be over-etched when the trench 150 is formed. At this time, a second recess region 150R may be formed. The substrate 100 under the trench 150 may be etched to a depth D2. For example, the depth D2 may be in a range of 5 nm to 150 nm. For example, the depth of the second recess region 150R may be smaller than the depth of the first recess region 124R. The second recess region 150R may have a positively sloped sidewall. Thus, a width WA of an upper portion of the second recess region 150R may be wider than that of a bottom surface of the second recess region 150R.

Figure 11A:
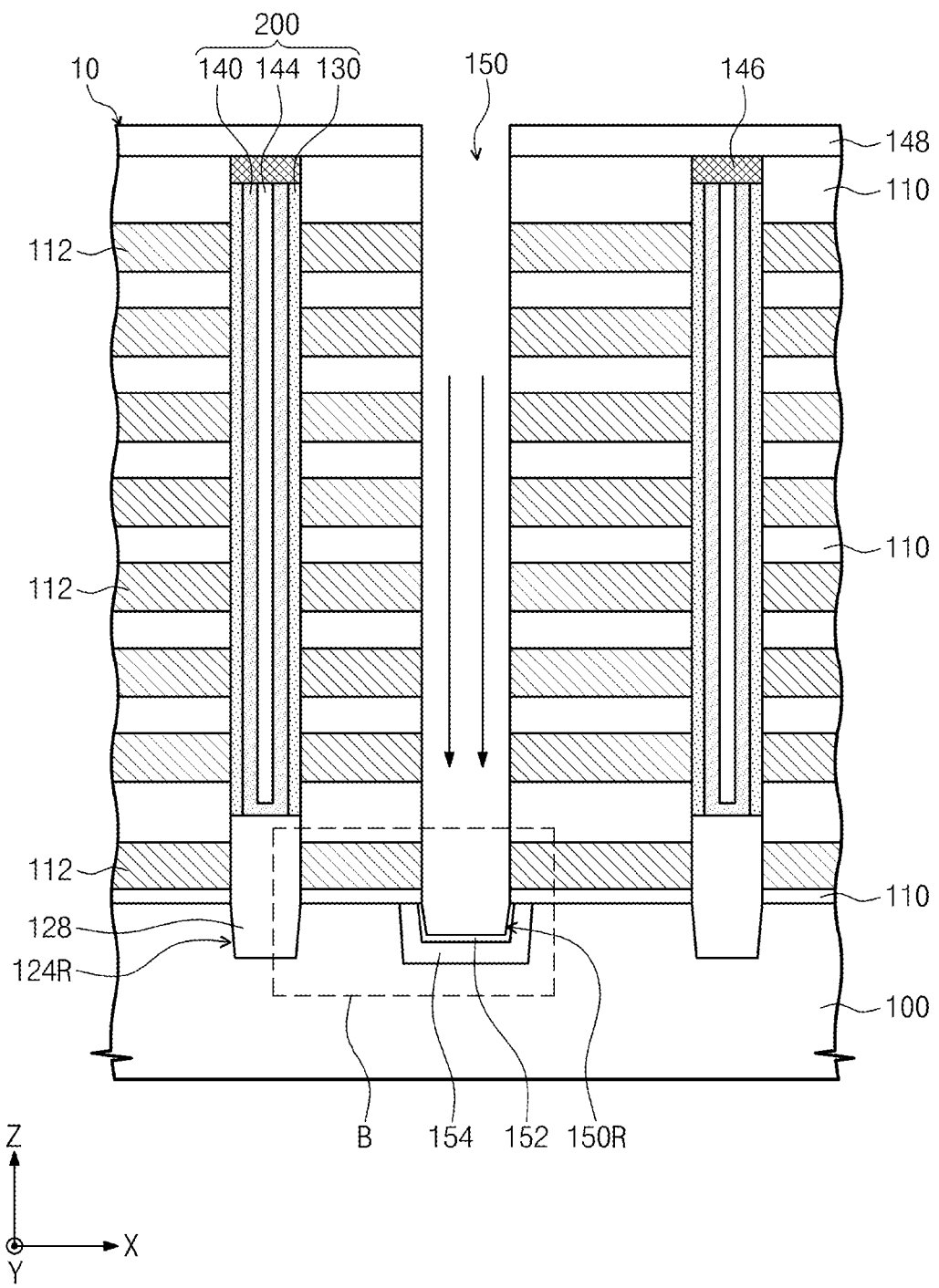
Figure 11B:
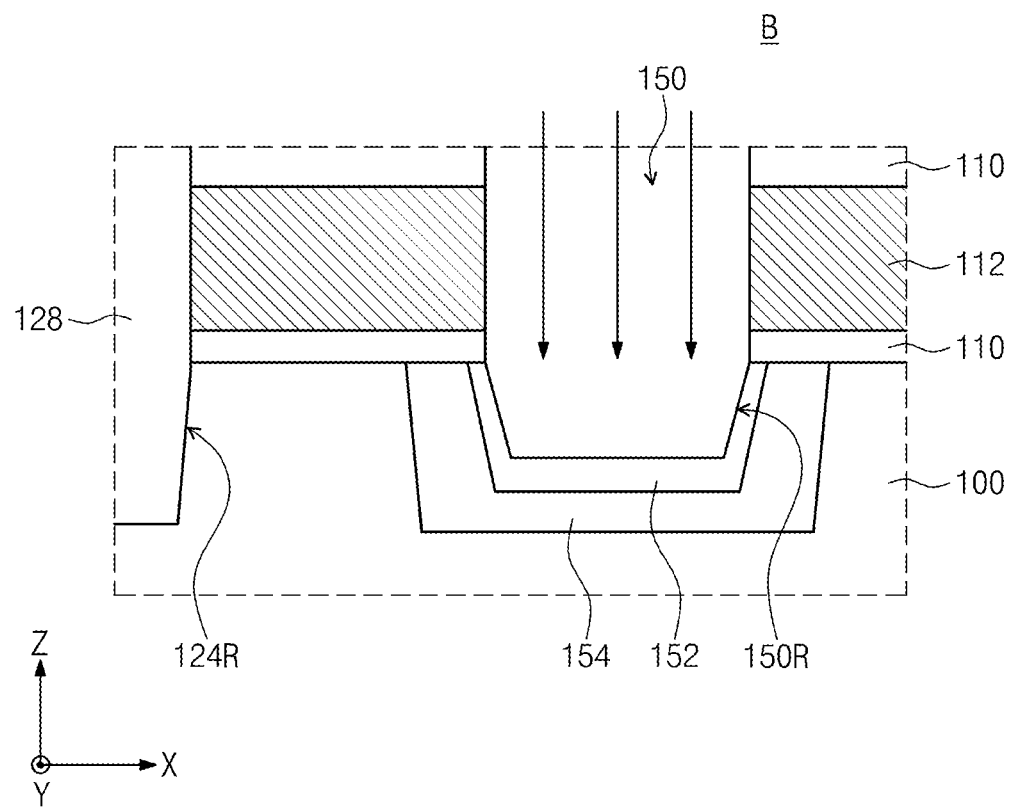

Referring to FIGS. 11A and 11B, an oxidation inhibiting layer 152 and a common source region 154 may be formed in the substrate 100 adjacent to the second recess region 150R. For example, the oxidation inhibiting layer 152 may be formed in or on the substrate 100 exposed by the second recess region 150R. The oxidation inhibiting layer 152 may be formed in a region adjacent to a surface, exposed by the second recess region 150R, of the substrate 100. In some example embodiments, the oxidation inhibiting layer 152 may be formed in the substrate adjacent to the second recess region 150R so as to surround the second recess region 150R. The oxidation inhibiting layer 152 may include an oxidation inhibiting material. For example, the oxidation inhibiting layer 152 may include nitrogen. In some example embodiments, the oxidation inhibiting layer 152 may be an impurity-doped layer including nitrogen. For example, impurities including nitrogen may be injected into the substrate 100, exposed by the second recess region 150R, through the trench 150 to form the doped layer including nitrogen which corresponds to the oxidation inhibiting layer 152. The doped layer including nitrogen may be formed by, for example, an ion implantation process. In some example embodiments, nitrogen ions or ions including nitrogen may be implanted with an energy of about 1 KeV to about 20 KeV during the ion implantation process for forming the doped layer including nitrogen. At this time, a dose of the nitrogen ions or ions including nitrogen may be in a range of about $10^{13}$ ions/cm$^2$ to about $10^{15}$ ions/cm$^2$. In some example embodiments, the oxidation inhibiting layer 152 may be formed more deeply from the bottom surface of the second recess region 150R than from the sidewall of the second recess region 150R. In some example embodiments, a concentration of oxidation inhibiting impurities (e.g., nitrogen) of the oxidation inhibiting layer 152 adjacent to the bottom surface of the second recess region 150R may be greater than that of the oxidation inhibiting impurities of the oxidation inhibiting layer 152 adjacent to the sidewall of the second recess region 150R. In other example embodiments, the doped layer including nitrogen may be formed by a plasma doping process. In some example embodiments, the oxidation inhibiting layer 152 may be a nitridation layer. For example, the oxidation inhibiting layer 152 may be a plasma nitridation layer formed by performing a plasma nitridation process on the surface of the substrate 100 adjacent to the second recess region 150R, or a RTN nitridation layer formed by a rapid thermal nitridation (RTN) process. For example, the plasma nitridation process may be performed using nitrogen (N$_2$) or ammonia (NH$_3$) in a plasma atmosphere having a temperature condition ranging from about 300° C. to about 700° C. At this time, a bias may be applied to the substrate 100 during the plasma nitridation process. In some example embodiments, the nitridation of the substrate 100 adjacent to the bottom surface of the second recess region 150R may be more activated by the bias applied to the substrate 100, and thus, the nitridation layer (e.g., the oxidation inhibiting layer 152) adjacent to the bottom surface of the second recess region 150R may be thicker than the nitridation layer adjacent to the sidewall of the second recess region 150R. For example, during the RTN process, the substrate 100 may be thermally treated in a nitrogen (N$_2$) or ammonia (NH$_3$) atmosphere having a temperature condition ranging from about 700° C. to about 1000° C.

The common source region 154 may be formed in the substrate 100 to surround the oxidation inhibiting layer 152. For example, the common source region 154 may surround the sidewall and the bottom surface of the second recess region 150R. The common source region 154 may include a conductive dopant region. Conductive dopant ions may be deeply implanted into the substrate 100 through the trench 150 to form the common source region 154 surrounding the oxidation inhibiting layer 152. The common source region 154 may include dopants of which a second conductivity type (e.g., an N-type) is different from the first conductivity type of the substrate 100. For example, N-type dopant ions (e.g., arsenic (As) ions or phosphorus (P) ions) may be implanted into the substrate 100 with an energy of about 3 KeV to about 30 KeV and a dose of about $10^{13}$ ions/cm$^2$ to about $10^{14}$ ions/cm$^2$, thereby making it possible to form the common source region 154.

Figure 12A:
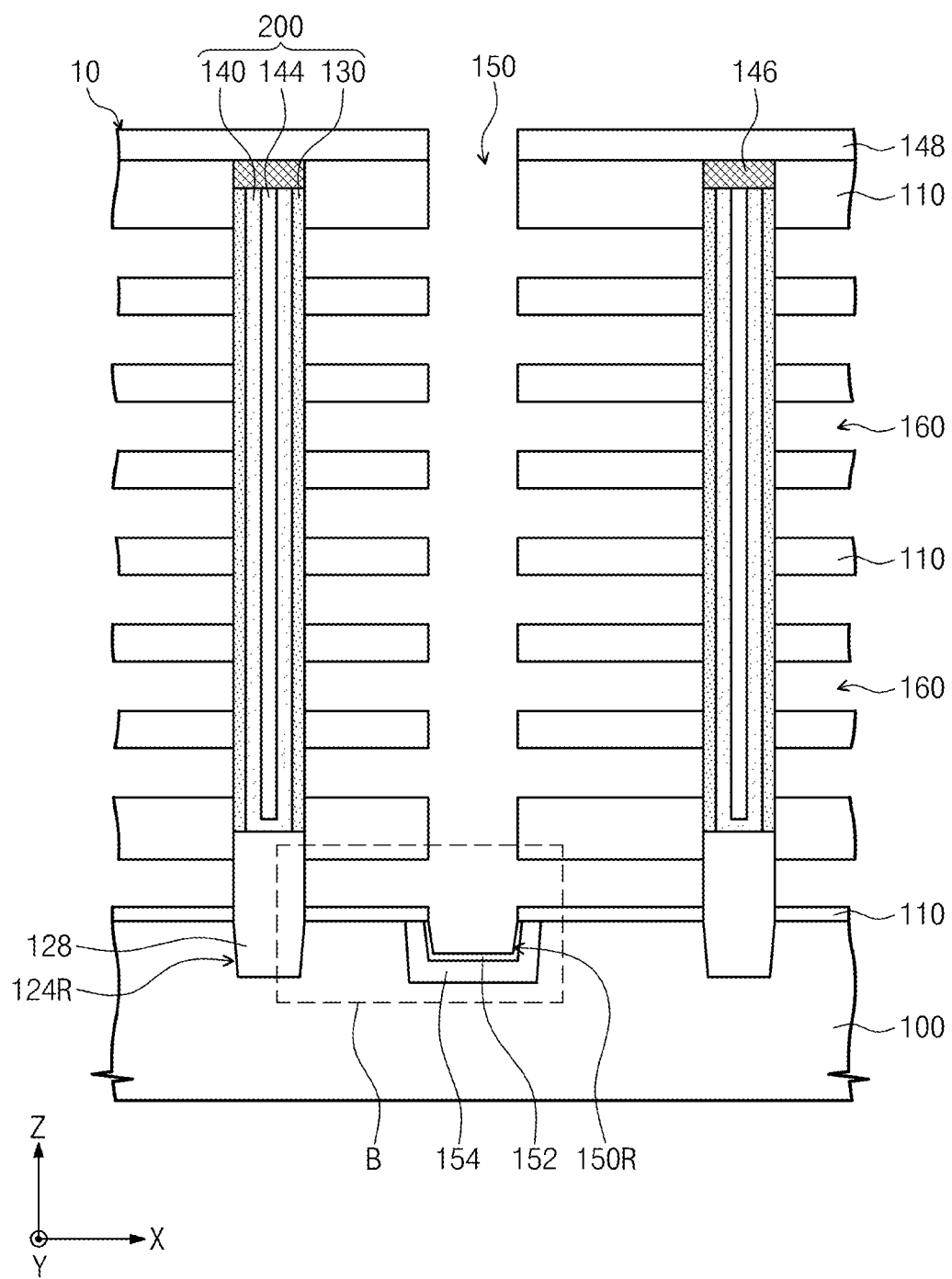
Figure 12B:
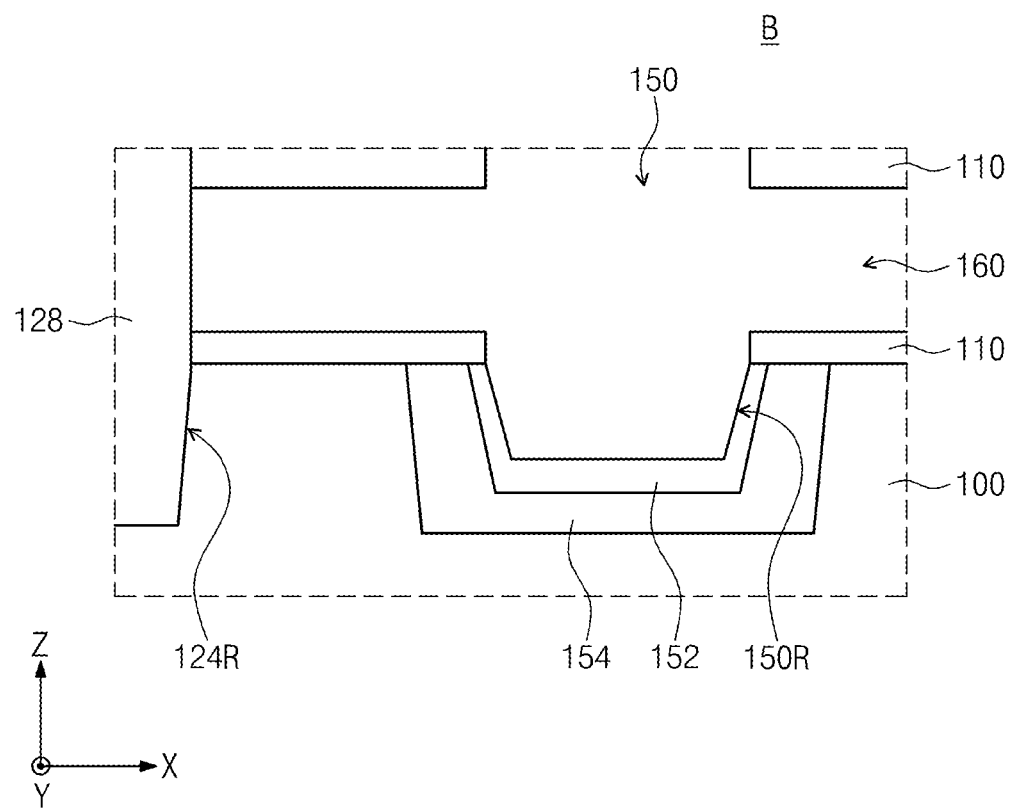

Referring to FIGS. 12A and 12B, opening regions 160 may be formed in the molding structure 10. The sacrificial layers 112 exposed by the trench 150 may be removed to form the opening regions 160 between the insulating layers 110. For example, if the sacrificial layers 112 are silicon nitride layers and the insulating layers 110 are silicon oxide layers, the sacrificial layers 112 may be isotropically etched using an etching solution including phosphoric acid to form the opening regions 160. The opening regions 160 may be regions in which gate electrodes are to be formed. The vertical channel structures 200 may be partially exposed by the opening regions 160. For example, the data storage pattern 130 of the vertical channel structure 200 may be exposed by the opening regions 160. For example, the first blocking dielectric layer 132 of FIG. 9B of the data storage pattern 130 may be exposed by the opening regions 160. In addition, a sidewall of the first vertical channel pattern 128 may be exposed by at least a lowermost one of the opening regions 160. The opening region 160 may extend in the first and second directions parallel to the main surface of the substrate 100.

Figure 13A:
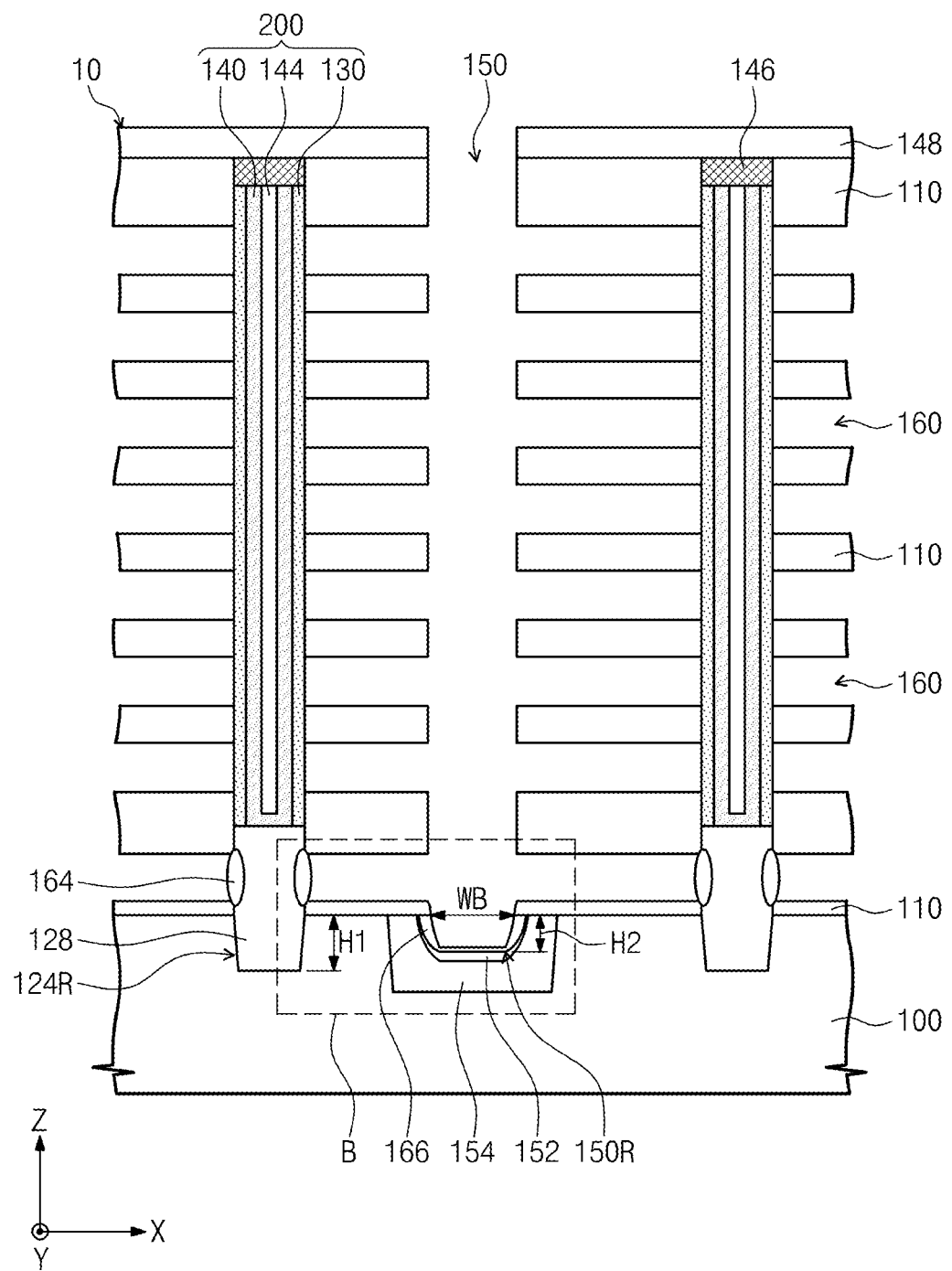
Figure 13B:
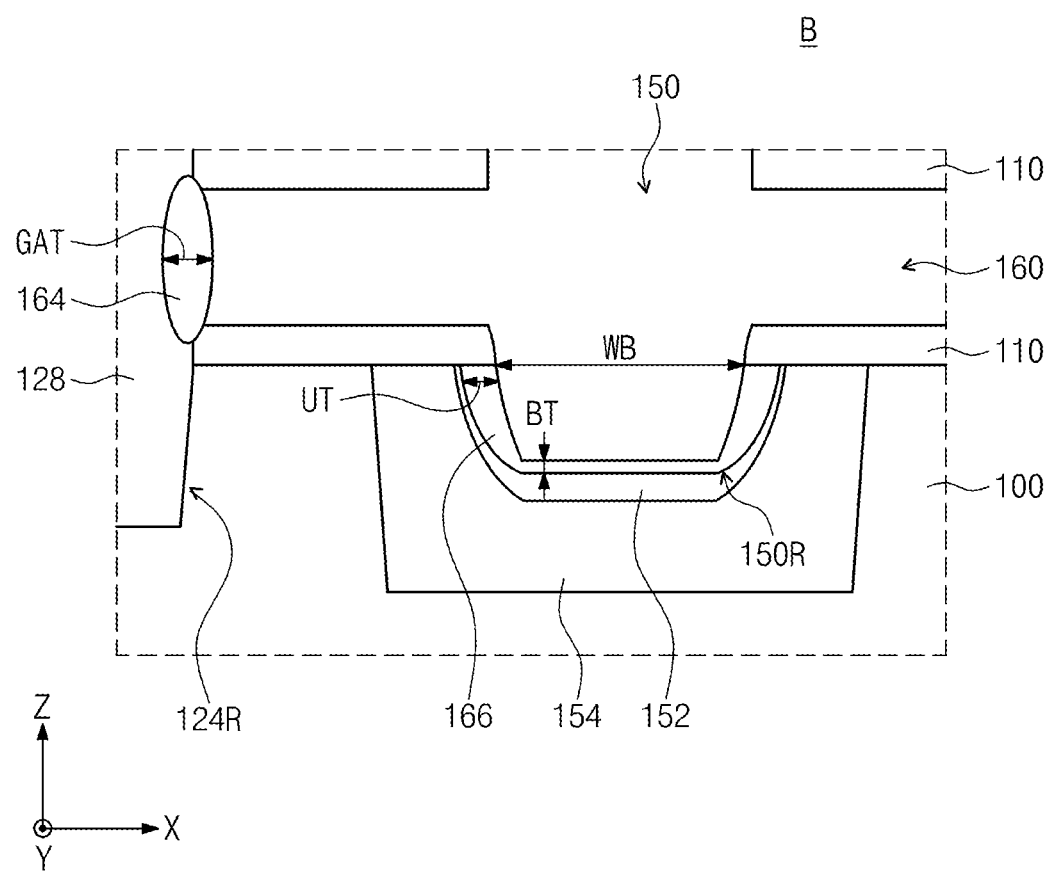

Referring to FIGS. 13A and 13B, a gate oxide layer 164 may be formed on the first vertical channel pattern 128, and a buffer oxide layer 166 may be formed in the second recess region 150R. For example, the sidewall of the first vertical channel pattern 128 exposed by the opening region 160 may be oxidized to form the gate oxide layer 164. At the same time, the substrate 100 exposed by the second recess region 150R may also be oxidized. In some example embodiments, the sidewall of the first vertical channel pattern 128 and the substrate 100 exposed by the second recess region 150R may be oxidized by the same thermal oxidation process. The gate oxide layer 164 formed by the thermal oxidation process may be used as a gate oxide layer of a ground selection transistor. Thus, the gate oxide layer 164 may have a thickness that is enough to reduce or prevent an operation error of the ground selection transistor. A central portion of the gate oxide layer 164 may have a thickness GAT. For example, the thickness GAT may be in a range of about 5 nm to about 20 nm.

Since the oxidation of the substrate 100 is inhibited by the oxidation inhibiting layer 152 surrounding the second recess region 150R, the buffer oxide layer 166 may be thinner than the gate oxide layer 164. For example, a thickness UT of an upper portion, which is formed on an upper portion of the sidewall of the second recess region 150R, of the buffer oxide layer 166 may be smaller than the thickness GAT of the gate oxide layer 164. For example, the thickness UT of the buffer oxide layer 166 may be in a range of about 3 nm to about 15 nm. A thickness of the buffer oxide layer 166 may become progressively less from the upper portion of the sidewall of the second recess region 150R toward the bottom surface of the second recess region 150R. In some example embodiments, the buffer oxide layer 166 may have the thick thickness UT on the upper portion of the sidewall of the second recess region 150R, and a thin thickness BT on the bottom surface of the second recess region 150R. For example, the thickness BT of the buffer oxide layer 166 on the bottom surface of the second recess region 150R may be in a range of about 1 nm to about 10 nm. The buffer oxide layer 166 may have a positively sloped sidewall. A top end of the second recess region 150R may have an opening width WB. The opening width WB of the second recess region 150R may be smaller than the width WA of the second recess region 150R illustrated in FIG. 10. A difference between the width WB and the width WA may be substantially equal to the thickness UT. However, due to the oxidation inhibiting layer 152, the buffer oxide layer 166 may be formed thinner than the thickness GAT of the gate oxide layer 164. Thus, the opening width WB of the top end of the second recess region 150R may be effectively great. The common source region 154 may be vertically and horizontally expanded during the thermal oxidation process for the formation of the buffer oxide layer 166.

Figure 14A:
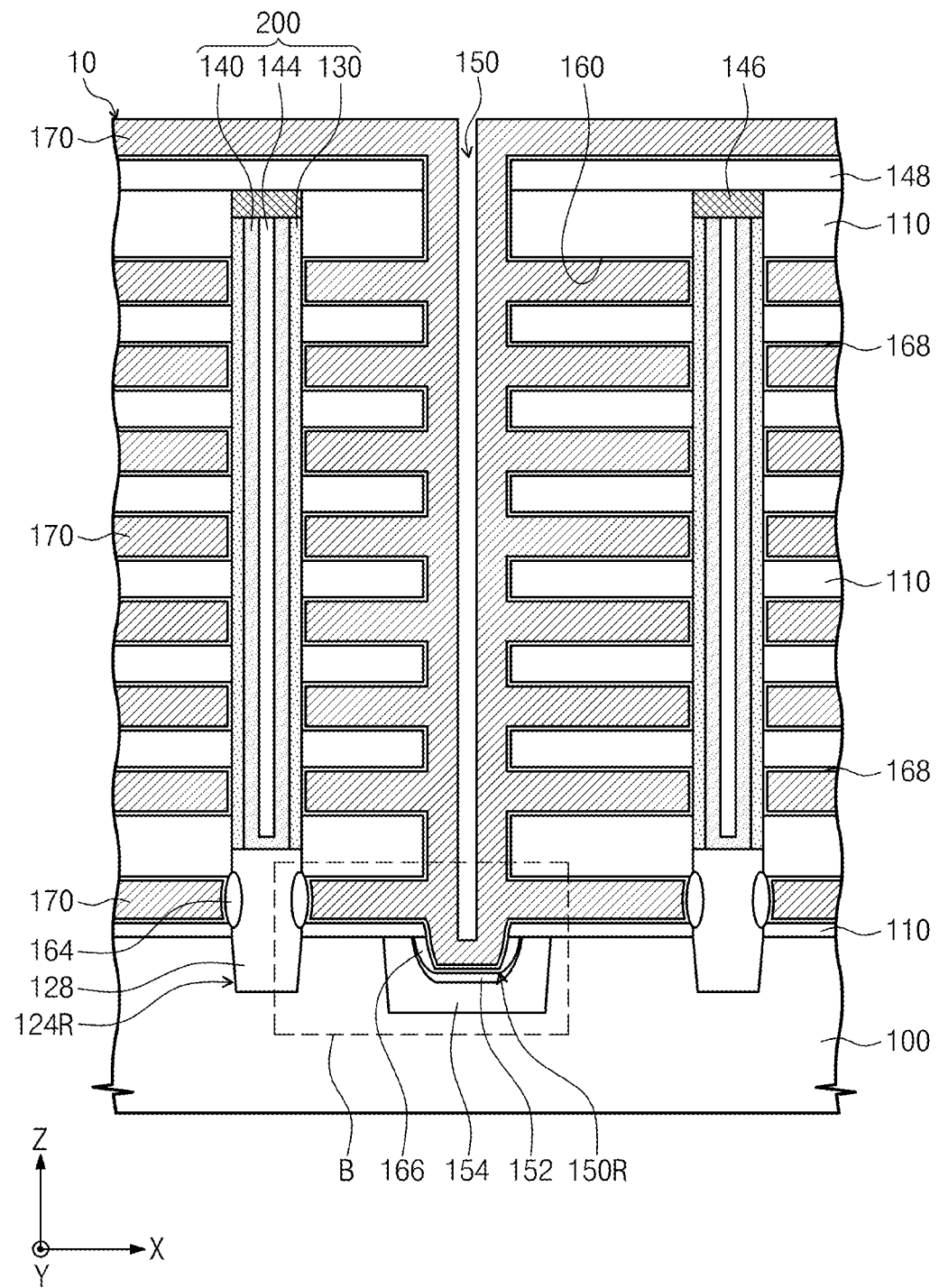
Figure 14B:
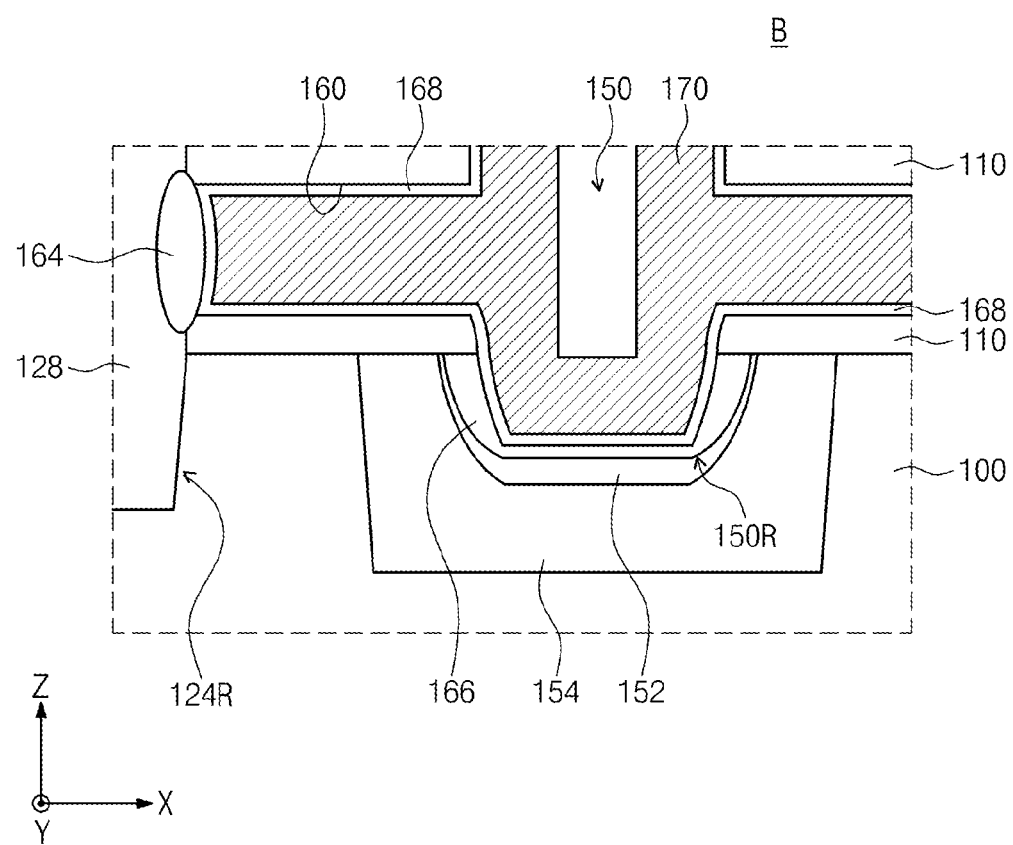

Referring to FIGS. 14A and 14B, a second blocking dielectric layer 168 and a gate conductive layer 170 may be sequentially formed on the substrate 100 to fill the opening regions 160. The second blocking dielectric layer 168 may be formed to conformally cover inner surfaces of the opening regions 160. For example, the second blocking dielectric layer 168 may be in contact with top and bottom surfaces of the insulating layers 110. The second blocking dielectric layer 168 may be in contact with the sidewalls of the vertical channel structures 200. For example, the second blocking dielectric layer 168 may be in contact with the first blocking dielectric layer 132. In addition, the second blocking dielectric layer 168 may extend into the second recess region 150R so as to be formed on the buffer oxide layer 166. In other example embodiments, the second blocking dielectric layer 168 may be omitted.

The gate conductive layer 170 may be formed to fill the opening regions 160 in which the second blocking dielectric layer 168 is formed. For example, the gate conductive layer 170 may include a conductive layer including a metal. For example, the gate conductive layer 170 may include a metal layer or a metal silicide layer. For example, the metal layer may include at least one of a nickel layer, a cobalt layer, a platinum layer, a titanium layer, a tantalum layer, or a tungsten layer. The metal layer may be formed using an ALD process or a CVD process. For example, the metal silicide layer may include at least one of a nickel silicide layer, a cobalt silicide layer, a platinum silicide layer, a titanium silicide layer, a tantalum silicide layer, or a tungsten silicide layer. For example, the metal silicide layer may be formed by a silicidation process. The silicidation process may include a step of depositing a poly-silicon layer and a metal layer to fill the opening regions 160 and a step of thermally treating the deposited poly-silicon layer and metal layer to form the metal silicide layer. The gate conductive layer 170 may fill at least a portion of the second recess region 150R.

Figure 15A:
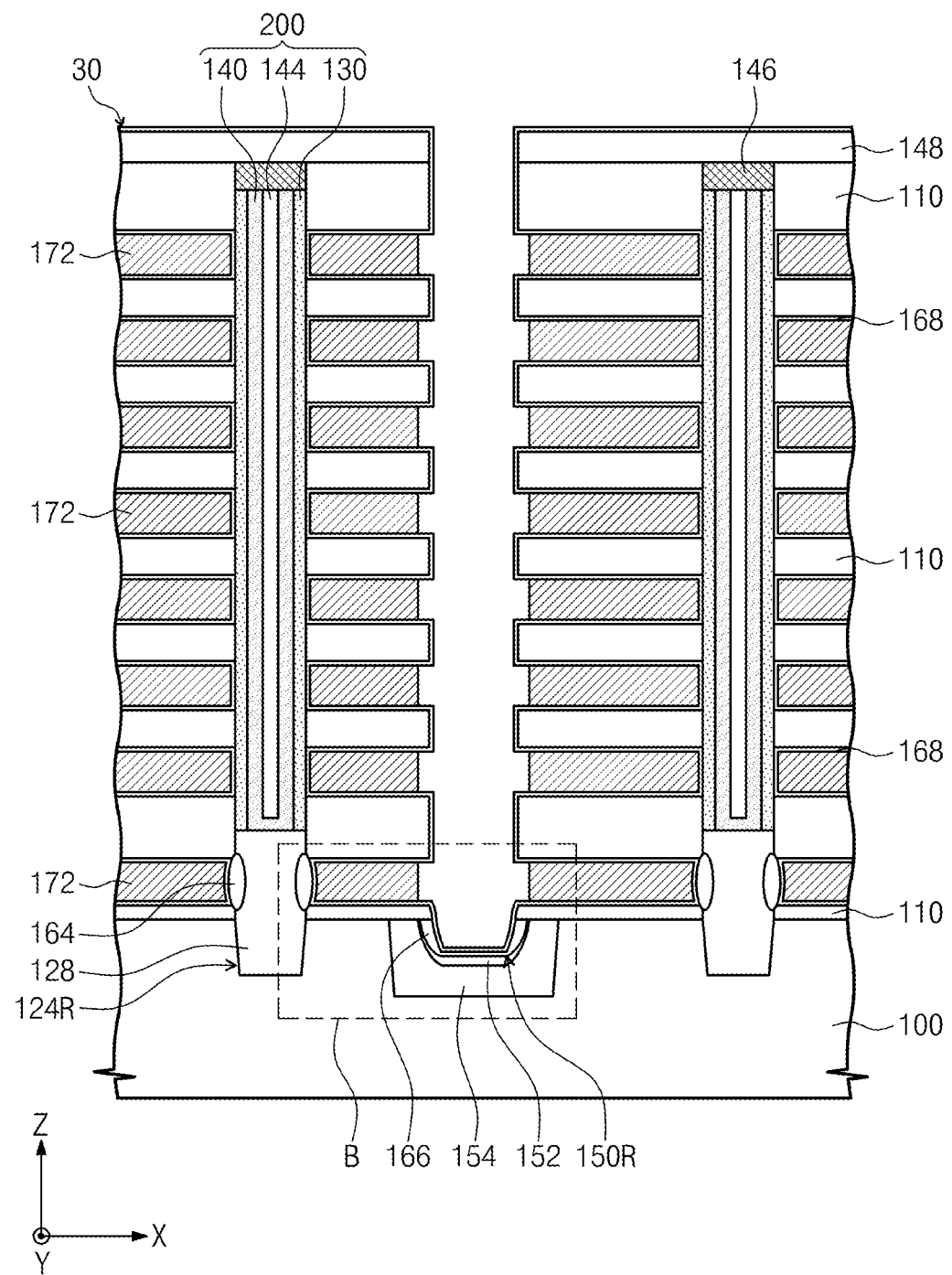
Figure 15B:
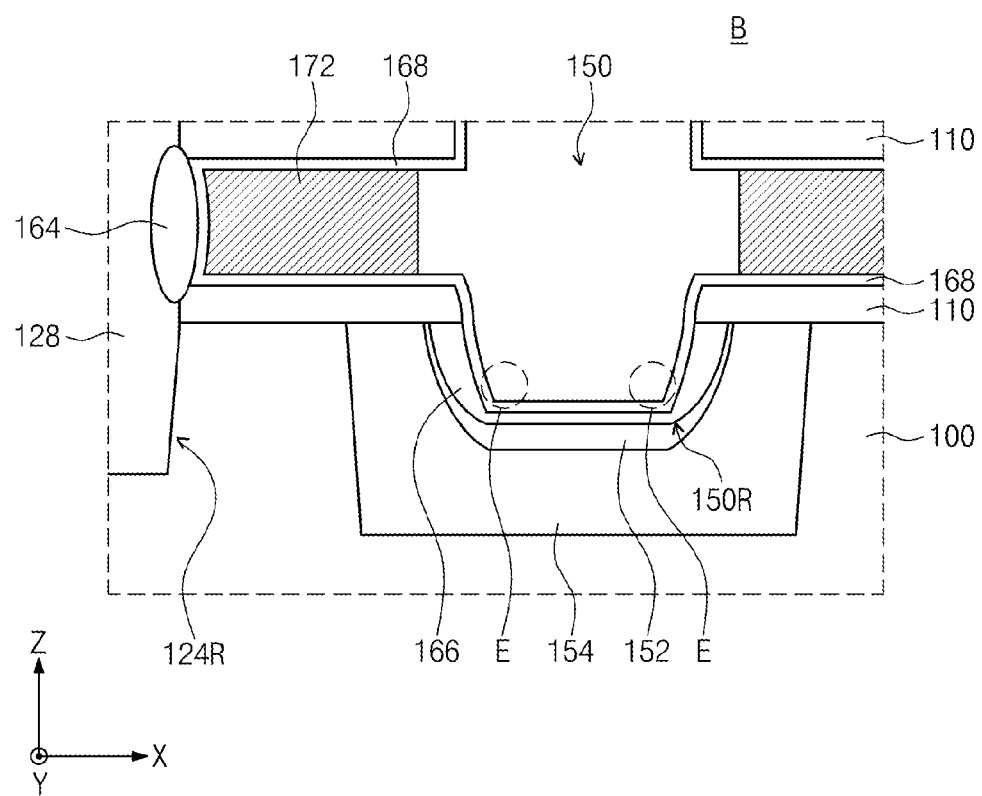

Referring to FIGS. 15A and 15B, stack structures 30 may be formed. Each of the stack structures 30 may include the insulating layers 110 and gate electrodes 172 disposed between the insulating layers 110. For example, the gate conductive layer 170 may be isotropically etched to form the gate electrodes 172 that are stacked and are separated from each other in the third direction. In some example embodiments, each of the gate electrodes 172 may have a truncated end portion that is recessed from sidewalls of the insulating layers 110 toward the vertical channel structure 200 in the first direction. Thus, the gate electrodes 172 adjacent to each other in the third direction may be physically separated from each other to reduce or prevent a short between the gate electrodes 172. The gate conductive layer 170 disposed in the second recess region 150R may also be completely removed during the process of etching the gate conductive layer 170. As described with reference to FIG. 13B, the second recess region 150R may have the effective opening width and the buffer oxide layer 166 may have the positively sloped sidewall during the process of etching the gate conductive layer 170. Thus, the gate conductive layer 170 may be completely removed in the second recess region 150R. For example, a residue of the gate conductive layer 170 does not remain in a bottom corner region E of the second recess region 150R. In other words, the gate conductive layer 170 formed on the second blocking dielectric layer 168 disposed in the bottom corner region E may be completely removed. Thus, it is possible to reduce or prevent a leakage current that may be caused by the residue of the gate conductive layer 170.

Figure 16A:
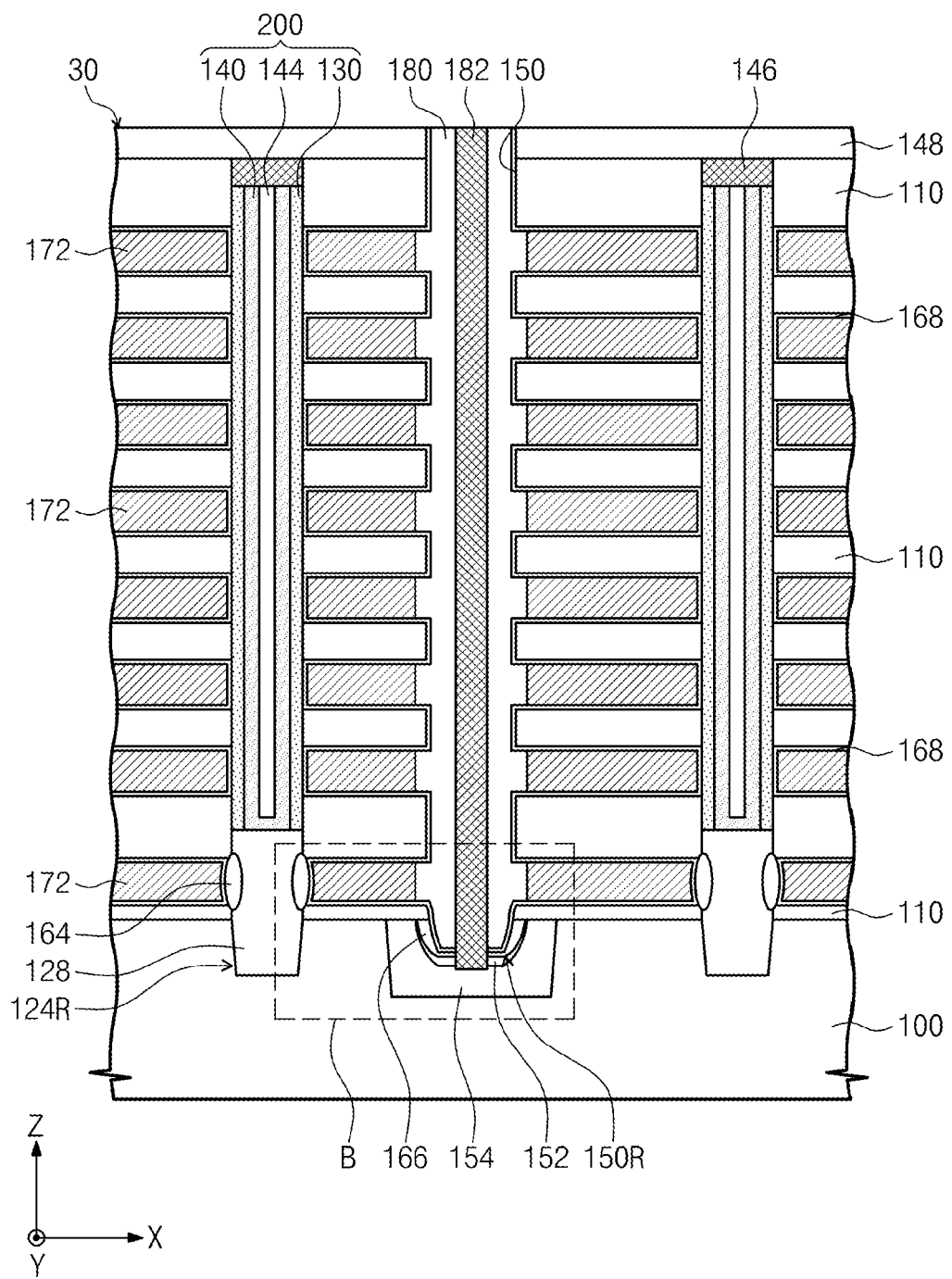
Figure 16B:
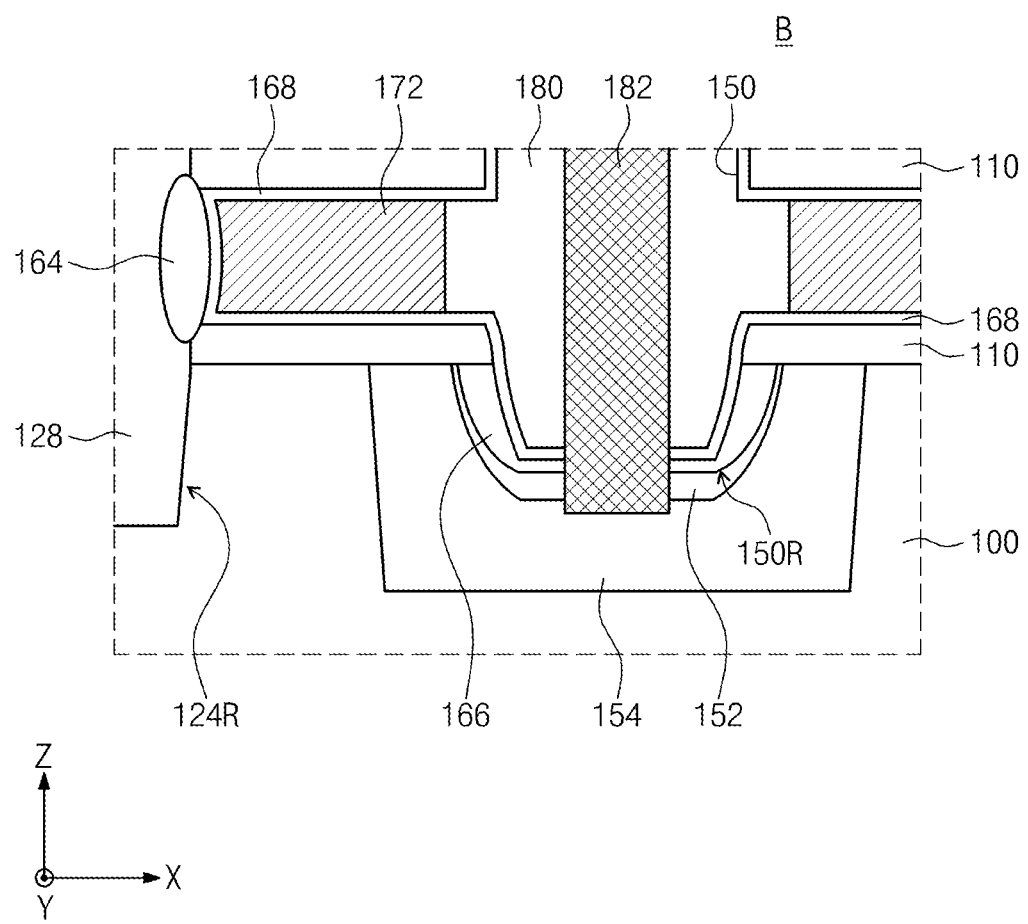

Referring to FIGS. 16A and 16B, an isolation insulating layer 180 and a source via plug 182 may be formed in the trench 150 between the stack structures 30. The isolation insulating layer 180 may be formed in the trench 150 to isolate the stack structures 30 from each other. For example, the isolation insulating layer 180 may isolate the gate electrodes 172 from each other in the first direction. The isolation insulating layer 180 may be in contact with the gate electrodes 172 and may fill spaces between the insulating layers 110 to protect the sidewalls of the gate electrodes 172. The isolation insulating layer 180 may partially fill the second recess region 150R. The isolation insulating layer 180 may include an oxide layer. After the formation of the isolation insulating layer 180, dopants having the second conductivity type (e.g., an N-type) may be additionally injected into the common source region 154. For example, N-type dopants such as phosphorus (P) or arsenic (As) may be injected into the common source region 154 by an ion implantation process, thereby reducing a resistance of the common source region 154.

The source via plug 182 may be formed on the common source region 154. The source via plug 182 may be connected to the common source region 154 to reduce the resistance of the common source region 154. The source via plug 182 may be disposed in a hole or slit penetrating the isolation insulating layer 180 in the trench 150. The source via plug 182 may penetrate the second blocking dielectric layer 168 and the buffer oxide layer 166 so as to be connected to the common source region 154. In some example embodiments, the source via plug 182 may penetrate a portion of the oxidation inhibiting layer 152 or may be in contact with the oxidation inhibiting layer 152. The source via plug 182 may have a linear shape extending in the second direction. Alternatively, the source via plug 182 may have an island shape. In this case, a plurality of the source via pugs 182 may be arranged in the second direction. The source via plug 182 may include a conductive material. The conductive material may include, for example, a metal such as tungsten or copper. A silicide layer that is in contact with the common source region 154 may be formed when the source via plug 182 is formed.

FIGS. 17A to 19A are cross-sectional views taken along a line I-I' of FIG. 1 to illustrate a method of fabricating a semiconductor memory device according to other example embodiments of the inventive concepts. FIGS. 17B to 19B are enlarged views of portions B' of FIGS. 17A to 19A, respectively.

In a method of fabricating a semiconductor memory device according to the present embodiment, processes of forming a molding structure 10, vertical channel structures 200, and a trench 150 may be the same as the processes described with reference to FIGS. 7, 8, 9A, 9B, and 10, and thus, the descriptions thereto will be omitted. In addition, the descriptions to the same processes as described with reference to FIGS. 11A to 16B will be omitted or mentioned briefly in the present embodiment. In other words, differences between the present embodiment and the aforementioned example embodiments will be mainly described hereinafter.

Figure 17A:
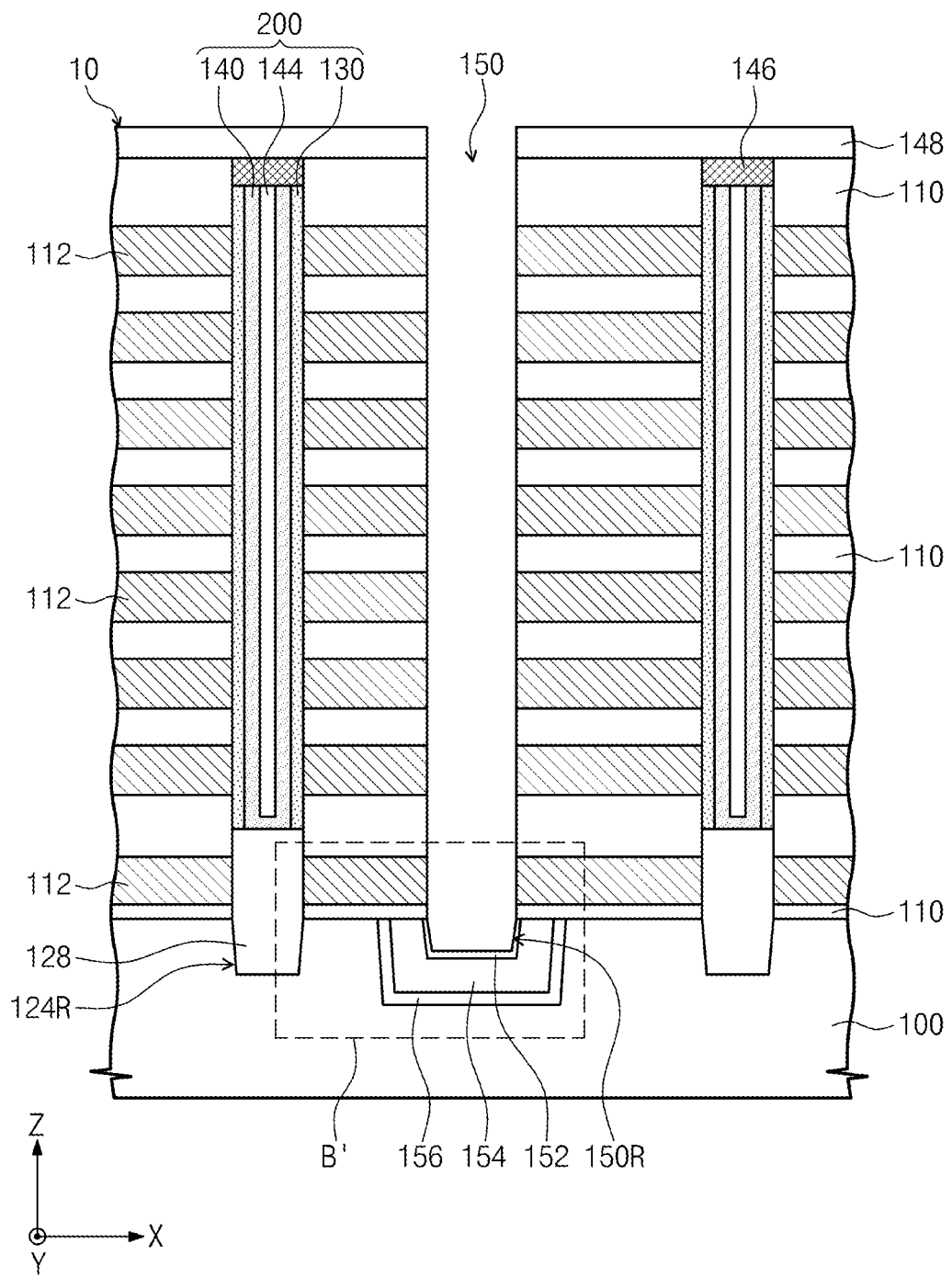
Figure 17B:
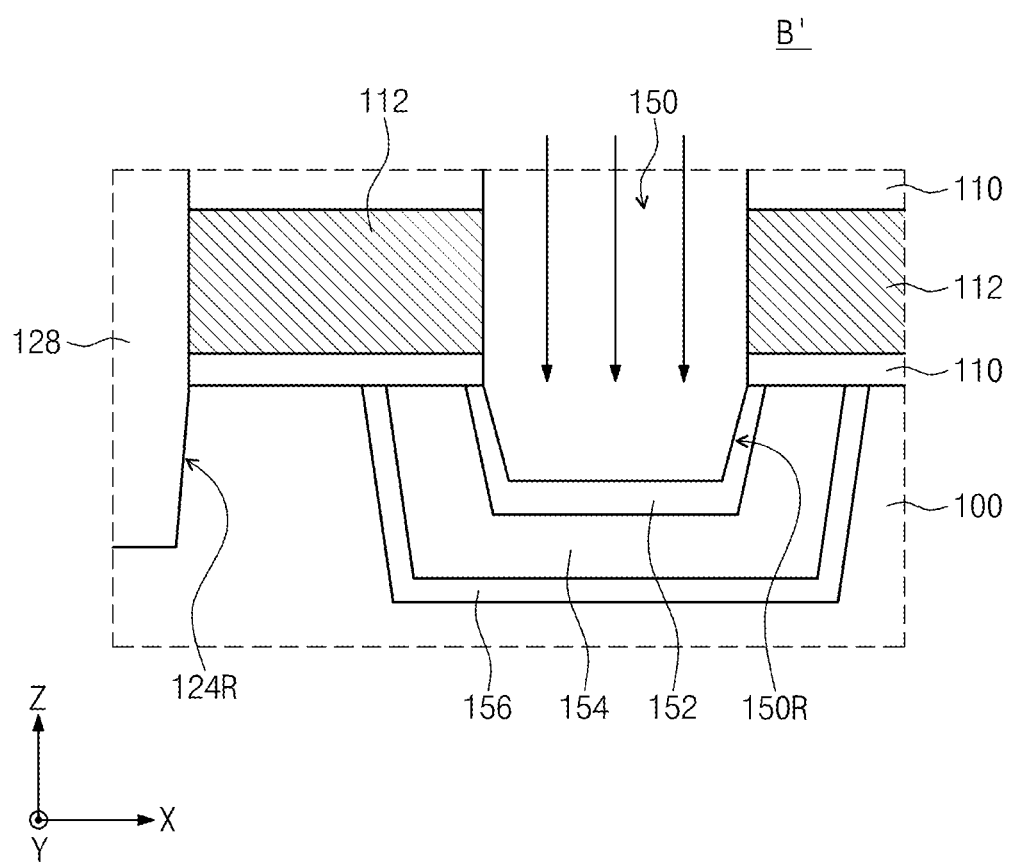

Referring to FIGS. 17A and 17B, an oxidation inhibiting layer 152, a common source region 154 surrounding the oxidation inhibiting layer 152, and a diffusion inhibiting layer 156 may be formed in the substrate 100 adjacent to the second recess region 150R. For example, the oxidation inhibiting layer 152 may be formed by the nitrogen ion implantation process or the nitridation process described with reference to FIGS. 11A and 11B. In addition, conductive dopant ions may be implanted to form the common source region 154 surrounding the oxidation inhibiting layer 152. Next, the diffusion inhibiting layer 156 may be formed to surround the common source region 154 by an ion implantation process. For example, the diffusion inhibiting layer 156 may include carbon. In some example embodiments, the diffusion inhibiting layer 156 may be a carbon-doped layer that is formed by implanting carbon ions into the substrate 100 through the trench 150. For example, the carbon ions may be implanted into the substrate 100 with an energy of about 5 KeV to about 30 KeV and a dose of about $10^{13}$ ions/cm$^2$ to about $10^{15}$ ions/cm$^2$ to form the carbon-doped layer. In some example embodiments, the diffusion inhibiting layer 156 may be formed before the formation of the common source region 154. The diffusion inhibiting layer 156 may inhibit the conductive dopants of the common source region 154 from being diffused toward the first vertical channel pattern 128 in the first direction. The diffusion inhibiting layer 156 may reduce or prevent the common source region 154 from being expanded toward the first vertical channel pattern 128. In other words, the diffusion inhibiting layer 156 may reduce or prevent a distance between the common source region 154 and the first vertical channel pattern 128 from being shortened by the expansion of the common source region 154.

Figure 18A:
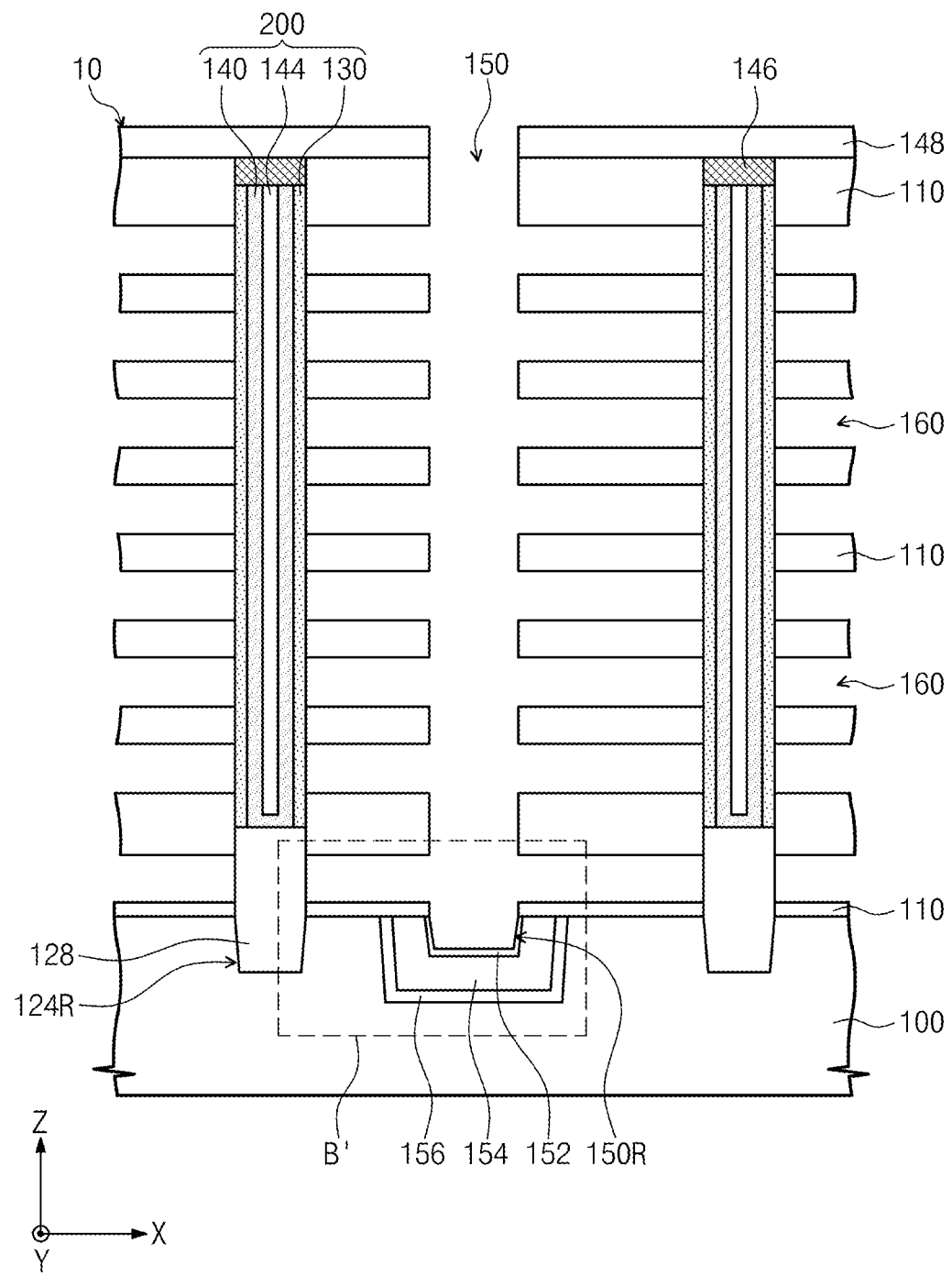
Figure 18B:
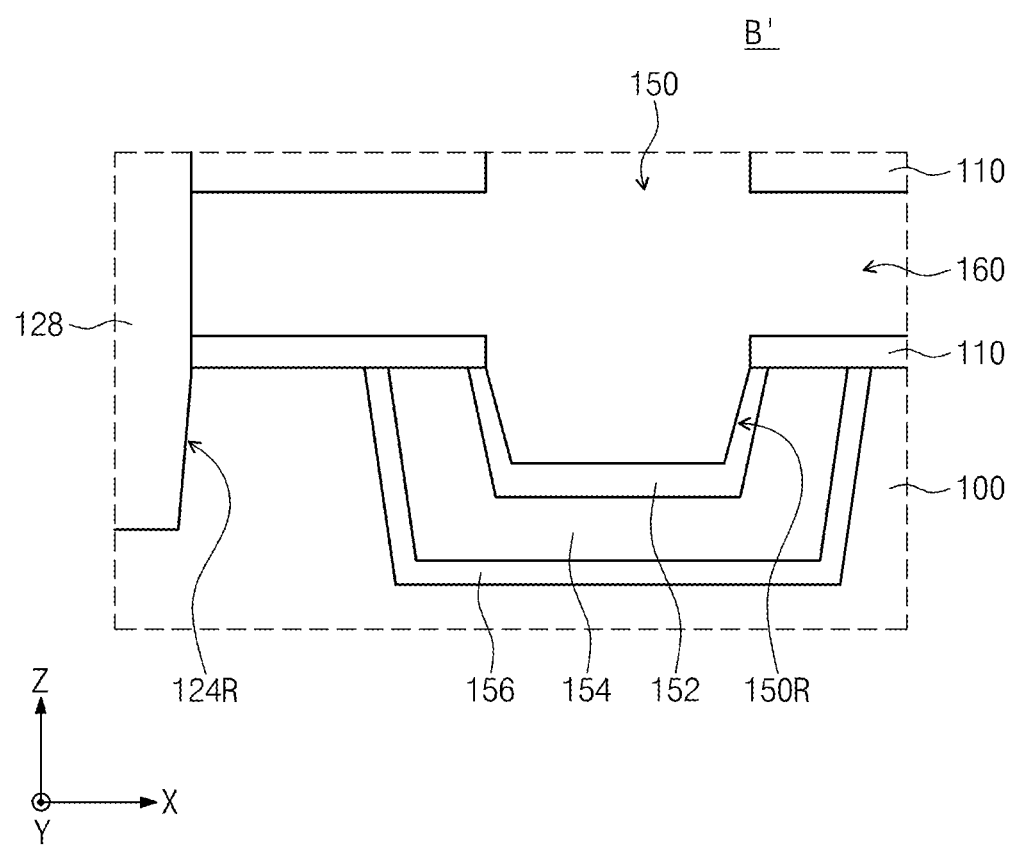

Referring to FIGS. 18A and 18B, the sacrificial layers 112 may be removed to form the opening regions 160, as described with reference to FIGS. 12A and 12B.

Figure 19A:
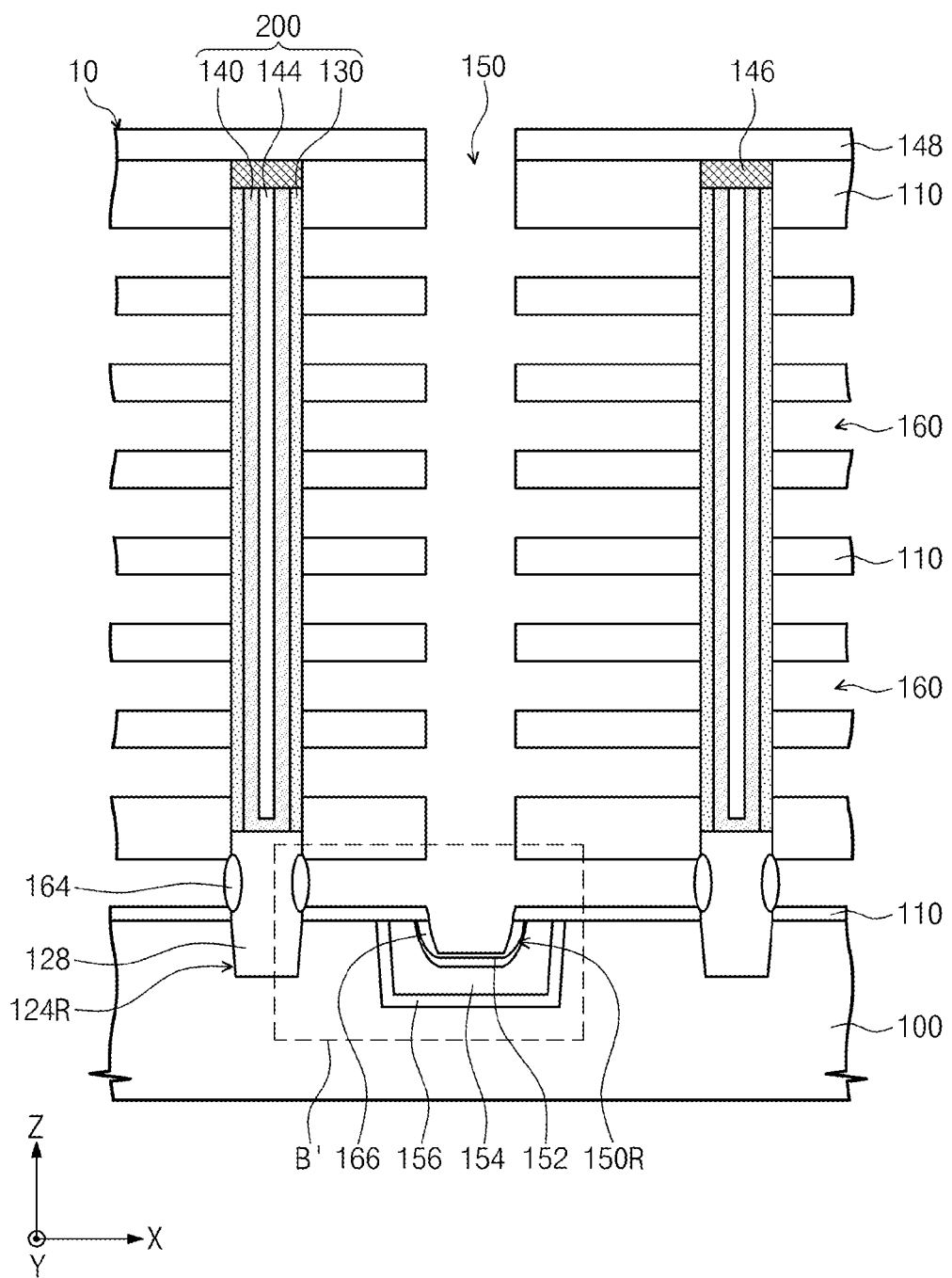
Figure 19B:
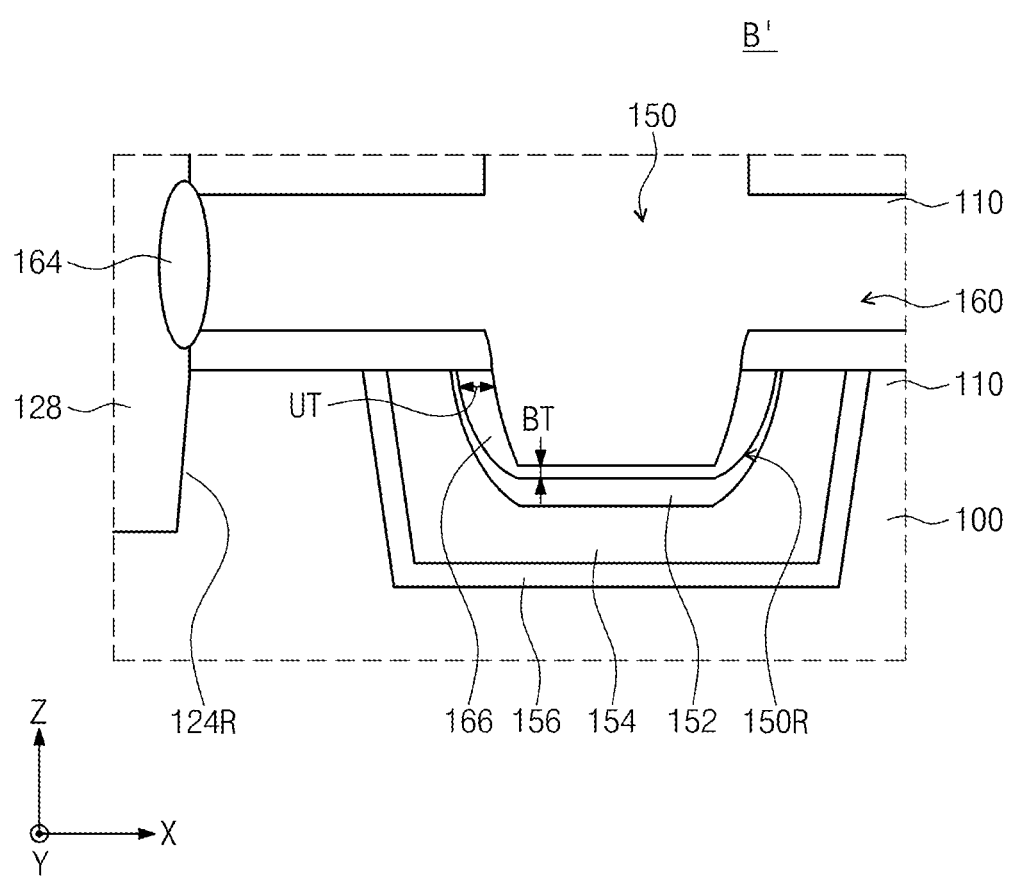

Referring to FIGS. 19A and 19B, as described with reference to FIGS. 13A and 13B, the thermal oxidation process may be performed to form the gate oxide layer 164 on the sidewall of the first vertical channel region 128 and the buffer oxide layer 166 in the second recess region 150R. The buffer oxide layer 166 may be formed to be thinner than the gate oxide layer 164 by the oxidation inhibiting layer 152. Since the thermal oxidation process may be performed at a high temperature, the dopants of the common source region 154 may be diffused vertically and horizontally with respect to the substrate 100. However, the diffusion of the dopants of the common source region 154 may be inhibited by the diffusion inhibiting layer 156, so the expansion of the common source region 154 may be restricted or minimized. As a result, a channel length of a ground selection transistor to be formed in a subsequent process may be sufficiently secured to improve reliability of the semiconductor memory device. Next, the same processes described with reference to FIGS. 14A to 16B may be performed.

Figure 20:
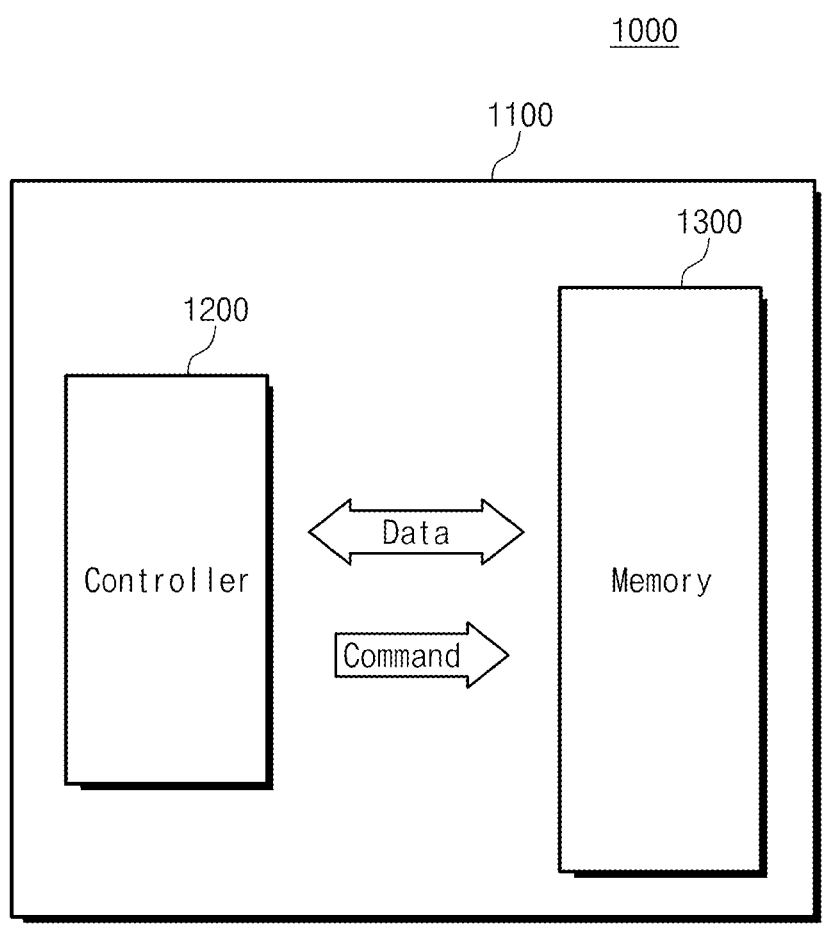
FIG. 20 is a schematic block diagram illustrating a semiconductor device system including a semiconductor memory device according to example embodiments of the inventive concepts.

FIG. 20 is a schematic block diagram illustrating a semiconductor device system including a semiconductor memory device according to some example embodiments of the inventive concepts.

Referring to FIG. 20, a memory system 1000 according to some example embodiments of the inventive concepts may be a semiconductor storage device. For example, the memory system 1000 may be a memory card or a solid state disk (SSD). The memory system 1000 may include a controller 1200 and a memory device 1300 which are disposed in a housing 1100. The controller 1200 may exchange electrical signals with the memory device 1300. For example, the controller 1200 may exchange data with the memory device 1300 in response to a command. Thus, the memory system 1000 may store data in the memory device 1300 or may output data from the memory device 1300 to an external system. The memory device 1300 may include at least one of the semiconductor memory devices according to some example embodiments of the inventive concepts.

Figure 21:
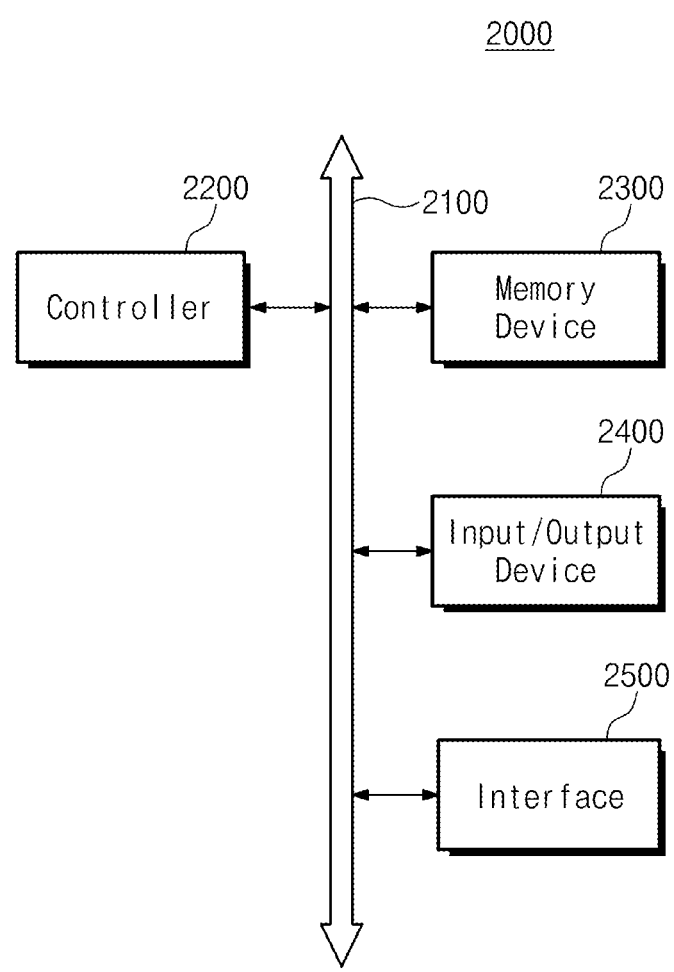
FIG. 21 is a schematic block diagram illustrating an electronic system including a semiconductor memory device according to example embodiments of the inventive concepts.

FIG. 21 is a schematic block diagram illustrating an electronic system including a semiconductor memory device according to some example embodiments of the inventive concepts.

Referring to FIG. 21, an electronic system 2000 may include a controller 2200, a memory device 2300, and an input/output device 2400. The controller 2200, the memory device 2300, and the input/output device 2400 may be coupled to each other through a data bus 2100. The data bus 2100 may correspond to a path that transmits data. For example, the controller 2200 may include at least one of a microprocessor, a digital signal processor, a microcontroller, or other logic devices. Functions of the other logic devices may be similar to any one of the microprocessor, the digital signal processor and the microcontroller. The input/output device 2400 may include at least one of a keypad, a keyboard, or a display device. The memory device 2300 is a device that stores data. The memory device 2300 may store data and/or commands to be executed by the controller 2200. The memory device 2300 may include a volatile memory device and/or a non-volatile memory device. Alternatively, the memory device 2300 may include a flash memory device. The flash memory device may be used to implement a solid state disk (SSD). In this case, the electronic system 2000 may stably store massive data in the memory device 2300. The memory device 2300 may include at least one of the semiconductor memory devices according to some example embodiments of the inventive concepts. The electronic system 200 may further include an interface unit 2500 that transmits data to a communication network or receives data from a communication network. The interface unit 2500 may operate by wireless or cable. For example, the interface unit 2500 may include an antenna or a wireless/cable transceiver.

The semiconductor memory devices according to the inventive concepts may be encapsulated using various packaging techniques. For example, the semiconductor devices according to inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to some example embodiments of the inventive concepts, after the oxidation inhibiting layer is formed at the substrate adjacent to the recess region, the gate oxide layer and the buffer oxide layer may be respectively formed on the sidewall of the first vertical channel pattern and in the recess region by the same oxidation process. The thickness of the buffer oxide layer may be reduced by the oxidation inhibiting layer. Thus, the recess region may have a sufficient width, thereby effectively removing the gate conductive layer formed in the recess region. Since the gate conductive layer may be completely removed, it is possible to reduce or prevent the leakage current which may be caused by a residue of the gate conductive layer. This means that the reliability of the semiconductor memory device may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method comprising:
    forming a molding structure on a substrate, the molding structure including insulating layers and sacrificial layers that are alternately and repeatedly stacked on the substrate;
    forming a plurality of vertical channel structures penetrating the molding structure, each of the vertical channel structures including
        a first vertical channel pattern on the substrate, and
        a second vertical channel pattern on the first vertical channel pattern;
    forming a trench penetrating the molding structure between the vertical channel structures, the trench including a first recess region, the first recess region being formed by at least partially recessing the substrate;
    forming an oxidation inhibiting layer in or on a portion of the substrate exposed by the first recess region such that the oxidation inhibiting layer is restricted to the first recess region;
    forming a common source region in the substrate, the common source region surrounding the oxidation inhibiting layer; and
    forming a buffer oxide layer on the oxidation inhibiting layer such that the buffer oxide layer is restricted to the first recess region.

2. The method of claim 1, wherein forming the vertical channel structures includes
    forming channel holes penetrating the molding structure, each of the channel holes comprising a second recess region that is formed by recessing the substrate;
    forming a plurality of first vertical channel patterns such that
        each first vertical channel pattern fills a separate second recess region of a separate one of the channel holes, and
        each first vertical channel pattern protrudes from the substrate; and
    forming a data storage pattern, the second vertical channel pattern, and a filling insulation pattern on each of the first vertical channel patterns, wherein the data storage pattern, the second vertical channel pattern, and the filling insulation pattern are sequentially stacked on an inner sidewall of each of the channel holes.

3. The method of claim 2, wherein the data storage pattern includes a blocking dielectric layer, a charge storage layer, and a tunnel dielectric layer, and the blocking dielectric layer, charge storage layer, and tunnel dielectric layer are sequentially formed on the inner sidewall of each of the channel holes.

4. The method of claim 1, wherein the first and second vertical channel patterns include a semiconductor material.

5. The method of claim 1, wherein the oxidation inhibiting layer includes nitrogen.

6. The method of claim 5, wherein the oxidation inhibiting layer is a doped layer including nitrogen and formed in the substrate, or a nitridation layer formed by performing a nitridation process on the substrate.

7. The method of claim 1, further comprising:
    forming a gate oxide layer on a sidewall of the first vertical channel pattern.

8. The method of claim 7, wherein the buffer oxide layer and the gate oxide layer are formed by a common oxidation process.

9. The method of claim 8, wherein a thickness of a central portion of the gate oxide layer is greater than a thickness of the buffer oxide layer formed on an upper portion of a sidewall of the first recess region.

10. The method of claim 1, further comprising:
    forming a diffusion inhibiting layer surrounding the common source region in the substrate.

11. The method of claim 10, wherein the diffusion inhibiting layer includes carbon.

12. A method comprising:
    forming a semiconductor pattern on a substrate, the semiconductor pattern protruding vertically from the substrate;

forming a recess region in the substrate;
forming an oxidation inhibiting layer in the substrate adjacent to the recess region such that the oxidation inhibiting layer is restricted to the recess region, the oxidation inhibiting layer surrounding the recess region and including nitrogen;
forming a gate oxide layer on a sidewall of the semiconductor pattern and a buffer oxide layer in the recess region by a common oxidation process such that the buffer oxide layer is restricted to the recess region;
forming a gate electrode on a sidewall of the gate oxide layer; and
forming a conductive via plug penetrating the buffer oxide layer.

13. The method of claim 12, wherein a thickness of a central portion of the gate oxide layer is greater than a thickness of the buffer oxide layer formed on an upper portion of a sidewall of the recess region.

14. The method of claim 12, further comprising:
forming a conductive dopant region surrounding the oxidation inhibiting layer; and
forming a diffusion inhibiting layer in the substrate, the diffusion inhibiting layer surrounding the conductive dopant region and including carbon.

15. A method of fabricating a semiconductor memory device, the method comprising:
forming vertical channel structures extending vertically on a substrate, each of the vertical channel structures comprising a first vertical channel pattern being in contact with the substrate and a second vertical channel pattern disposed on the first vertical channel pattern;
forming a recess region in the substrate between the vertical channel structures;
forming a gate oxide layer including a central portion with a first thickness on a sidewall of the first vertical channel pattern;
forming a buffer oxide layer in the recess region, the buffer oxide layer having a second thickness on an upper portion of a sidewall of the recess region and a third thickness on a bottom surface of the recess region, and the second and third thicknesses being smaller than the first thickness;
forming a common source region adjacent to the buffer oxide layer in the substrate; and
forming gate electrodes surrounding the vertical channel structures and stacked in a direction vertical to the substrate.

16. The method of claim 15, wherein
forming the vertical channel structures includes forming a tunnel dielectric layer, a charge storage layer, and a blocking dielectric layer on the first vertical channel pattern of each of the vertical channel structures,
the second vertical channel pattern is connected to the first vertical channel pattern,
the blocking dielectric layer is adjacent to the gate electrodes,
the tunnel dielectric layer is in contact with the second vertical channel pattern, and
the charge storage layer is disposed between the tunnel dielectric layer and the blocking dielectric layer.

17. The method of claim 15, wherein the second thickness of the buffer oxide layer is greater than the third thickness of the buffer oxide layer.

18. The method of claim 15, further comprising:
forming an oxidation inhibiting layer including nitrogen between the buffer oxide layer and the common source region.

19. The method of claim 18, wherein the oxidation inhibiting layer is a doped layer including nitrogen and formed in the substrate, or a nitridation layer formed by performing a nitridation process on the substrate.

20. The method of claim 18, further comprising:
forming a diffusion inhibiting layer surrounding the common source region in the substrate,
wherein the diffusion inhibiting layer inhibits the common source region from being expanded toward the first vertical channel pattern, and
wherein the diffusion inhibiting layer includes carbon.

* * * * *